United States Patent
Liaw

(10) Patent No.: US 11,049,554 B2
(45) Date of Patent: Jun. 29, 2021

(54) SRAM ARRAY

(71) Applicant: TAIWAN SEMICONDUCTOR MANUFACTURING CO., LTD., Hsinchu (TW)

(72) Inventor: Jhon-Jhy Liaw, Zhudong Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/892,932

(22) Filed: Jun. 4, 2020

(65) Prior Publication Data

US 2020/0302995 A1 Sep. 24, 2020

Related U.S. Application Data

(63) Continuation of application No. 16/660,242, filed on Oct. 22, 2019, now Pat. No. 10,679,693, which is a continuation of application No. 16/035,006, filed on Jul. 13, 2018, now Pat. No. 10,460,794.

(51) Int. Cl.
*G11C 11/41* (2006.01)
*G11C 11/412* (2006.01)
*H01L 27/11* (2006.01)
*G11C 11/417* (2006.01)

(52) U.S. Cl.
CPC ........ *G11C 11/412* (2013.01); *H01L 27/1104* (2013.01); *G11C 11/417* (2013.01)

(58) Field of Classification Search
CPC .. G11C 11/412; G11C 11/417; G11C 14/0054
See application file for complete search history.

(56) References Cited

U.S. PATENT DOCUMENTS

| 10,283,193 | B2 | 5/2019 | Liaw | |
|---|---|---|---|---|
| 2013/0141963 | A1 | 6/2013 | Liaw | |
| 2014/0131813 | A1* | 5/2014 | Liaw | H01L 29/0657 257/401 |
| 2016/0372182 | A1* | 12/2016 | Liaw | G11C 5/063 |
| 2017/0032835 | A1 | 2/2017 | Liaw | |
| 2019/0096474 | A1 | 3/2019 | Pao et al. | |

* cited by examiner

*Primary Examiner* — Han Yang
(74) *Attorney, Agent, or Firm* — Birch, Stewart, Kolasch & Birch, LLP

(57) ABSTRACT

SRAM arrays are provided. In each SRAM cell arranged in a column of cell array, a pull-down transistor and a pass-gate transistor are formed in P-type well region. A pull-up transistor is formed in N-type well region. At least one well strap cell includes an N-well strap structure formed on the N-type well region and a P-well strap structure formed on the P-type well region. A first distance between the active region of the N-well strap structure and the P-type well region is greater than a second distance between an active region of the pull-up transistor and the P-type well region.

20 Claims, 20 Drawing Sheets

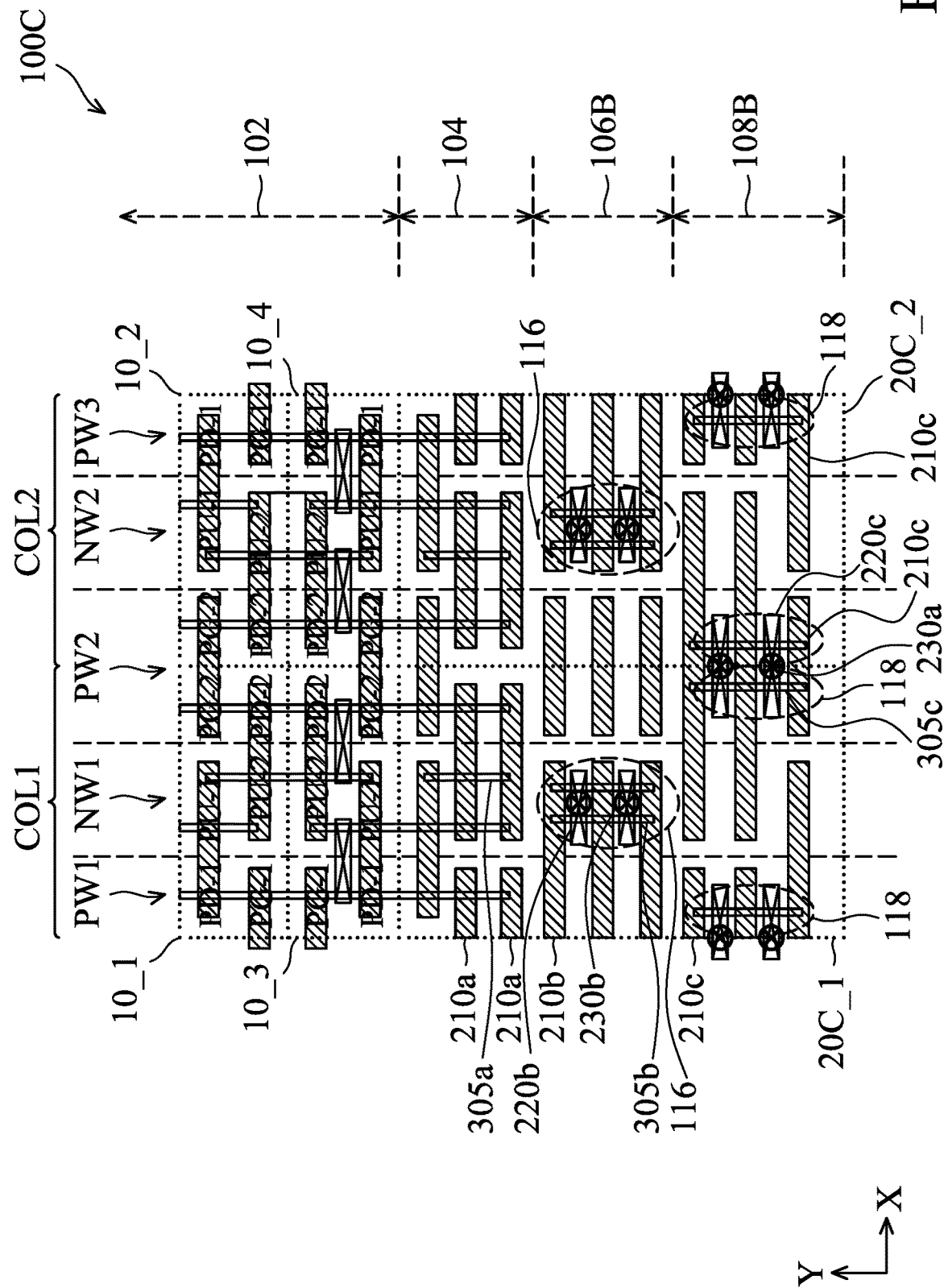

SRAM ARRAY

CROSS REFERENCE TO RELATED APPLICATIONS

This Application is a Continuation of U.S. application Ser. No. 16/660,242, filed on Oct. 22, 2019 which is a Continuation of U.S. application Ser. No. 16/035,006, filed on Jul. 13, 2018, the entirety of which are incorporated by reference herein.

BACKGROUND

Memories are commonly used in integrated circuits. For example, a static random access memory (SRAM) is a volatile memory used in electronic applications where high speed, low power consumption, and simplicity of operation are needed. Embedded SRAM is particularly popular in high-speed communications, image processing, and system-on-chip (SOC) applications. SRAM has the advantage of being able to hold data without requiring a refresh.

SRAM includes a plurality of bit cells disposed in rows and columns to form an array. Each bit cell includes a plurality of transistors coupled to bit lines and word lines that are used to read and write a bit of data to the memory cell. Single-port SRAMs enable a single bit of data to be written to or read from a bit cell at a particular time.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIG. 8 shows an example layout of an SRAM array, in accordance with some embodiments of the disclosure.

DETAILED DESCRIPTION

Figure 1A:
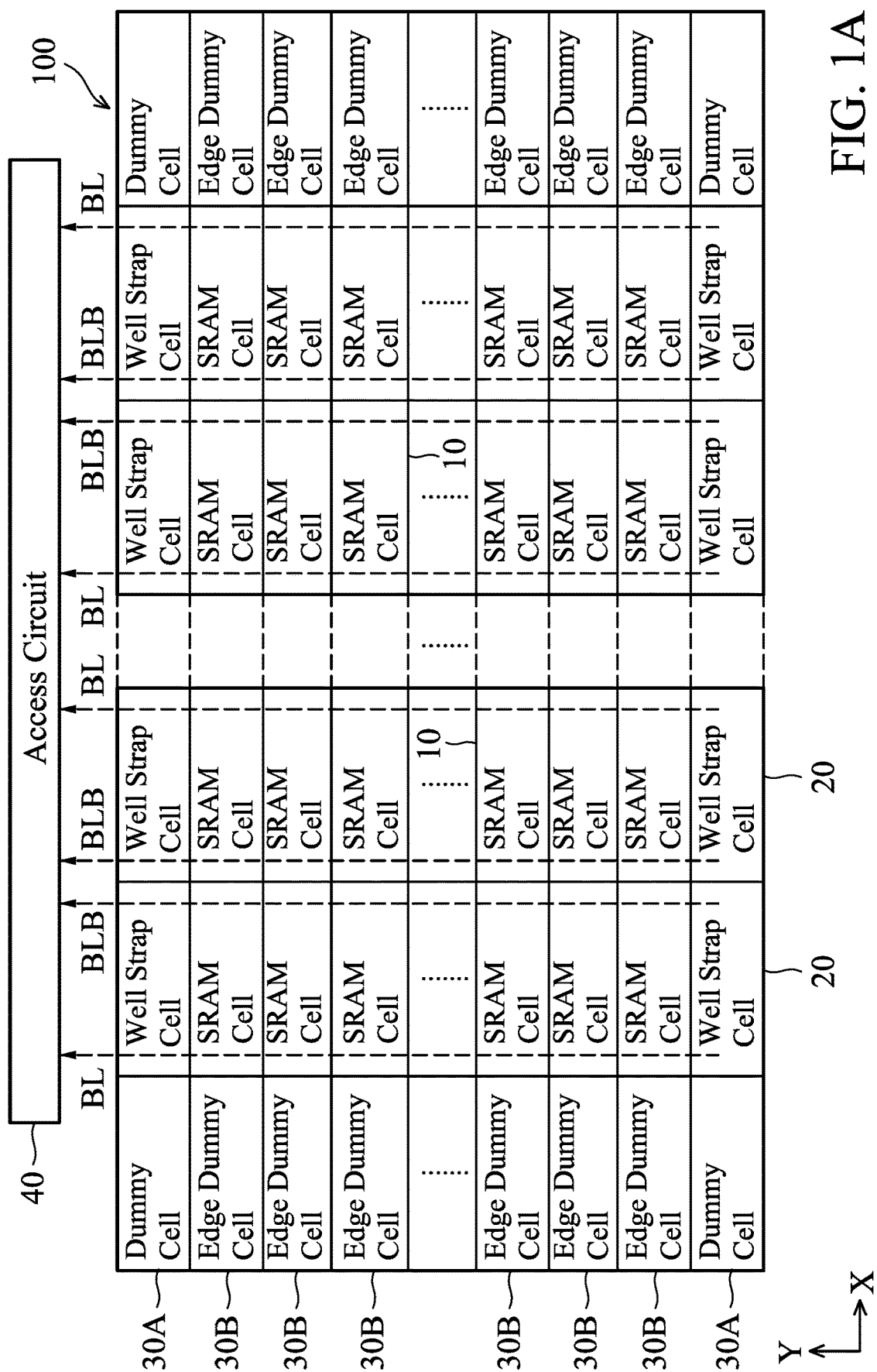
FIG. 1A shows a simplified diagram of a SRAM array, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various static random access memory (SRAM) arrays are provided in accordance with various exemplary embodiments. Some variations of some embodiments are discussed. Throughout the various views and illustrative embodiments, like reference numbers are used to designate like elements.

FIG. 1A shows a simplified diagram of a SRAM array 100, in accordance with some embodiments of the disclosure. The SRAM array 100 includes a cell array formed by multiple SRAM cells (or called bit cells) 10, and the SRAM cells 10 are arranged in a plurality of rows and a plurality of columns in the cell array. The SRAM array 100 also includes a plurality of well strap cells 20 and a plurality of dummy cells 30A and 30B.

The SRAM cells 10 are configured to be electrically connected to an access circuit 40. In some embodiments, the access circuit 40 includes the selector, driver and/or sense amplifier for accessing the SRAM cells 10. In the SRAM array 100, each SRAM cell 10 has the same rectangular shape/region, e.g., the widths of the SRAM cells 10 are the same, and the heights of the SRAM cells 10 are the same. The configurations of the SRAM cells 10 are described below.

Well strap cells 20 are configured to make overall SRAM array performance more uniform among the inner cells and the dummy cells of the SRAM array 100. The well strap cells 20 include a plurality of N-well strap structures and a plurality of P-well strap structures. Each N-well strap structure is configured to form an electrical connection between a voltage line (e.g., VDD line) and an N-type well region in a substrate. Each P-well strap structure is configured to form an electrical connection between a voltage line (e.g., VSS line) and a P-type well region in the substrate. These connections are used to help with uniform charge distribution throughout the SRAM array 100. In the SRAM array 100, the well strap cells 20 are arranged on both ends of each column. Thus, each column includes 2 well strap cells 20 in the SRAM array 100.

Each SRAM cell 10 includes a bit line BL extending in the Y-direction, a complementary bit line BLB extending in the Y-direction, a word line WL (not shown) extending in the X-direction, a connection to a VSS line (not shown), and a connection to a VDD line (not shown). The bit line BL of each SRAM cell 10 is coupled with the bit line BL of adjacent SRAM cells 10 in the same column of the SRAM array 100, so as to form a bit line across SRAM array 100 in the Y-direction. The complementary bit line BLB of each SRAM cell 10 is coupled with the complementary bit line BLB of the adjacent SRAM cells 10 in the same column of the SRAM array 100, so as to form a complementary bit line across SRAM array 100 in the Y-direction.

In the fabrication of SRAM cells 10, the cell array formed by the SRAM cells 10 may be surrounded by the well strap cells 20 and the dummy cells 30A and 30B, and the well strap cells 20 and the dummy cells 30A and 30B are dummy cells for the cell array. In some embodiments, the well strap cells 20 are arranged to surround the cell array horizontally, and the dummy cells 30A and 30B are arranged to surround the cell array vertically. The shapes and sizes of the well strap cells 20 and the dummy cells 30A and 30B are determined according to actual application. In some embodiments, the shapes and sizes of the well strap cells 20 and the dummy cells 30A and 30B are the same as the SRMA cells 10. In some embodiments, the shapes and sizes of the well strap cells 20, the dummy cells 30A and 30B are different from the SRAM cells 10.

Figure 1B:
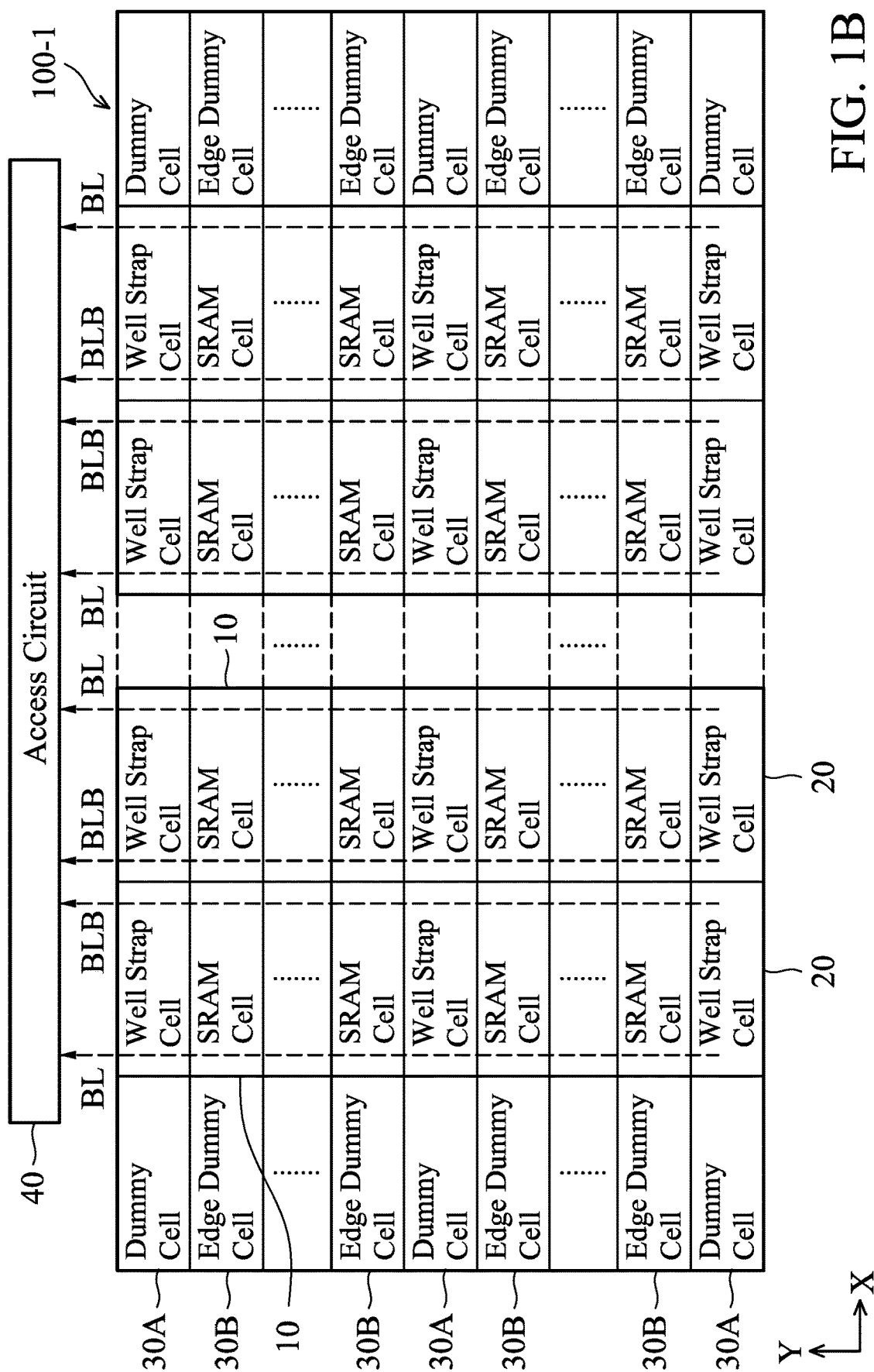
FIG. 1B shows a simplified diagram of a SRAM array, in accordance with some embodiments of the disclosure.

FIG. 1B shows a simplified diagram of a SRAM array 100_1, in accordance with some embodiments of the disclosure. The SRAM array 100_1 includes multiple SRAM cells (or called bit cells) 10, and the SRAM cells 10 are arranged in a plurality of rows and a plurality of columns in a first cell sub-array and a second cell sub-array. The SRAM array 100_1 also includes a plurality of well strap cells 20 and a plurality of dummy cells 30A and 30B.

The SRAM cells 10 are configured to be electrically connected to an access circuit 40. In some embodiments, the access circuit 40 includes the selector, driver and/or sense amplifier for accessing the SRAM cells 10. In the SRAM array 100_1, each SRAM cell 10 has the same rectangular shape/region, e.g., the widths of the SRAM cells 10 are the same, and the heights of the SRAM cells 10 are the same.

Well strap cells 20 are configured to make overall SRAM array performance more uniform among the inner cells and the dummy cells of the SRAM array 100_1. The well strap cells 20 include N-well strap structures that make an electrical connection between a voltage line and an N-type well region in a substrate, and P-well strap structures that make an electrical connection between a voltage line and a P-type well region in the substrate. These connections are used to help with uniform charge distribution throughout the SRAM array 100_1. In the SRAM array 100_1, the well strap cells 20 are arranged on both ends and middle (e.g., between the first and second cell sub-arrays) of each column. Thus, compared with the SRAM array 100, each column includes 3 well strap cells 20 in the SRAM array 100_1.

Each SRAM cell 10 includes a bit line BL extending in the Y-direction, a complementary bit line BLB extending in the Y-direction, a word line WL (not shown) extending in the X-direction, a connection to a VSS line (not shown), and a connection to a VDD line (not shown). The bit line BL of each SRAM cell 10 is coupled with the bit line BL of adjacent SRAM cells 10 in the same column of the SRAM array 100_1 to form a bit line across SRAM array 100_1. The complementary bit line BLB of each SRAM cell 10 is coupled with the complementary bit line BLB of the adjacent SRAM cells 10 in the same column of the SRAM array 100_1 to form a complementary bit line across SRAM array 100_1 in the Y-direction.

In FIG. 1B, the first cell sub-array is arranged between the access circuit 40 and the second cell sub-array. Furthermore, the N-type well regions and the P-type well regions are continued from the first cell sub-array to the second cell sub-array in each column of the SRAM array 100_1. Similarly, the bit line BL and the complementary bit line BLB are continued from the first cell sub-array to the second cell sub-array in each column of the SRAM array 100_1.

Figure 1C:
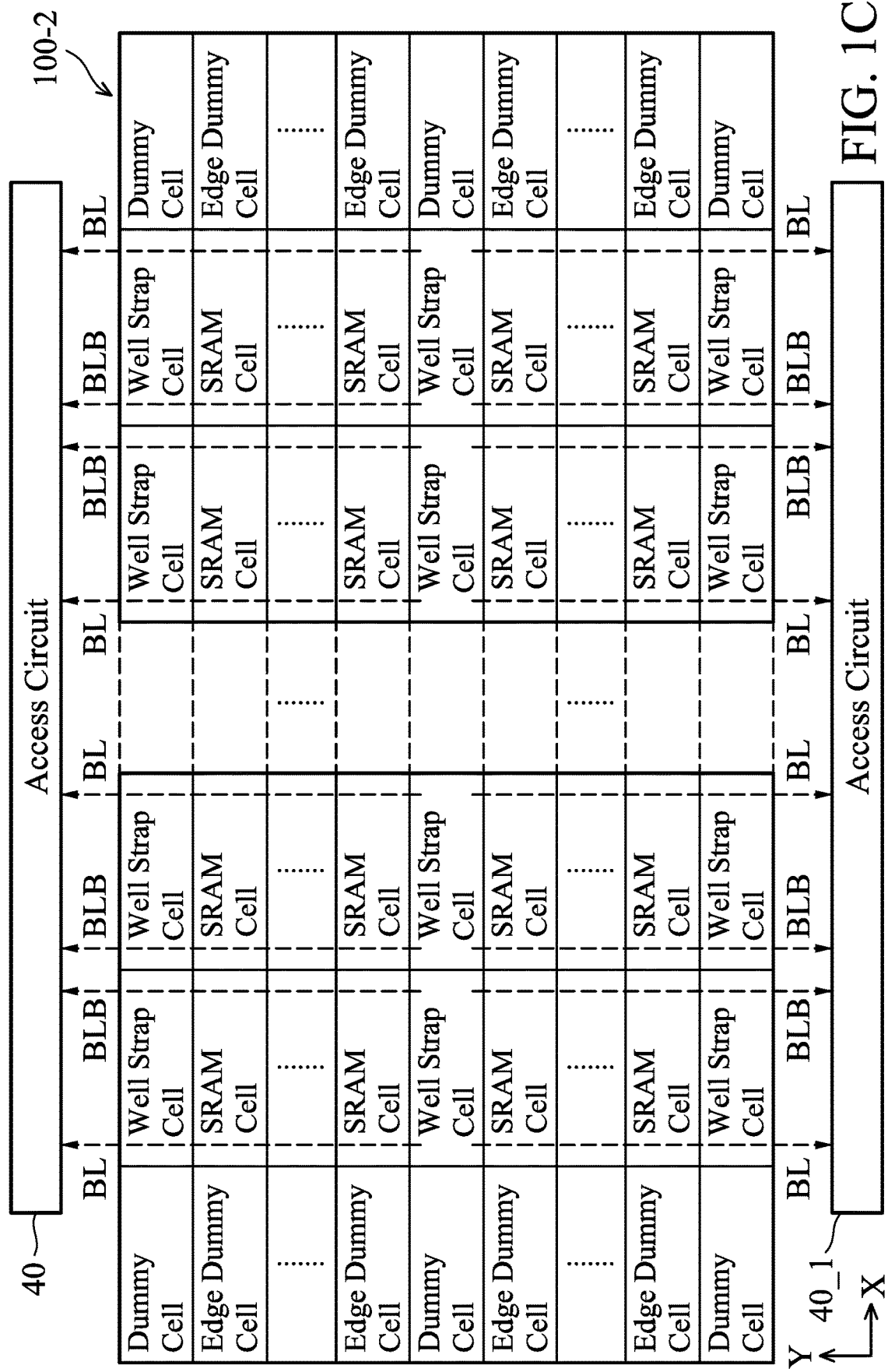
FIG. 1C shows a simplified diagram of a SRAM array, in accordance with some embodiments of the disclosure.

FIG. 1C shows a simplified diagram of a SRAM array 100_2, in accordance with some embodiments of the disclosure. The SRAM array 100_2 includes multiple SRAM cells (or called bit cells) 10, and the SRAM cells 10 are arranged in a plurality of rows and a plurality of columns in a first cell sub-array and a second cell sub-array. The SRAM array 100_2 also includes a plurality of well strap cells 20 and a plurality of dummy cells 30A/30B.

In FIG. 1C, the first cell sub-array is arranged between the access circuit 40 and the second cell sub-array, and the second cell sub-array is arranged between the access circuit 40_1 and the first cell sub-array. Furthermore, the N-type well regions and the P-type well regions are continued from the first cell sub-array to the second cell sub-array in each column of the SRAM array 100_2.

Compared with the SRAM array 100_1 of FIG. 1B, the bit lines BL and the complementary bit line BLB of the SRAM cells 10 included in the first cell sub-array, are configured to be electrically connected to the access circuit 40 in the SRAM array 100_2. The bit line BL and the complementary bit line BLB of the SRAM cells 10 included in the second cell sub-array are configured to be electrically connected to the access circuit 40_1 different from the access circuit 40. Thus, the bit line BL and the complementary bit line BLB are discontinued between the first cell sub-array and the second cell sub-array in each column of the SRAM array 100_2.

Figure 2A:
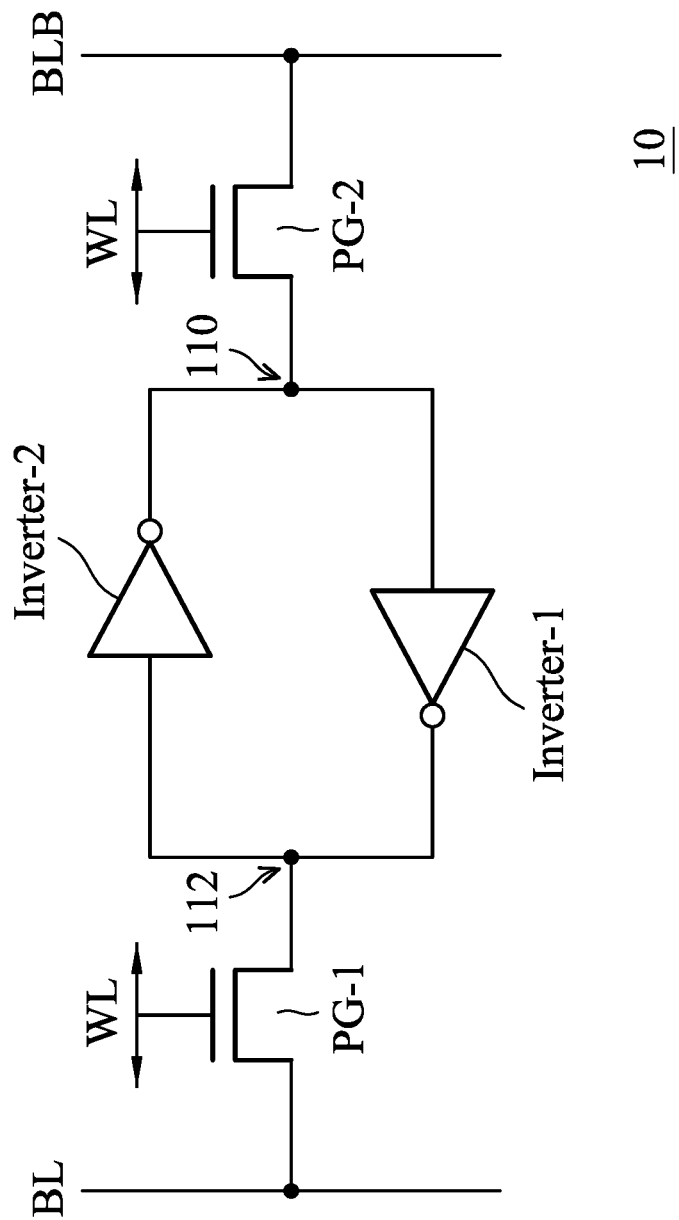
FIG. 2A shows a single-port SRAM cell, in accordance with some embodiments of the disclosure.

FIG. 2A shows a single-port SRAM cell 10, in accordance with some embodiments of the disclosure. The bit cell 10 includes a pair of cross-coupled inverters Inverter-1 and Inverter-2, and two pass-gate transistors PG-1 and PG-2. The inverters Inverter-1 and Inverter-2 are cross-coupled between the nodes 112 and 110, and form a latch. The pass-gate transistor PG-1 is coupled between a bit line BL and the node 112, and the pass-gate transistor PG-2 is coupled between a complementary bit line BLB and the node 110, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors.

Figure 2B:
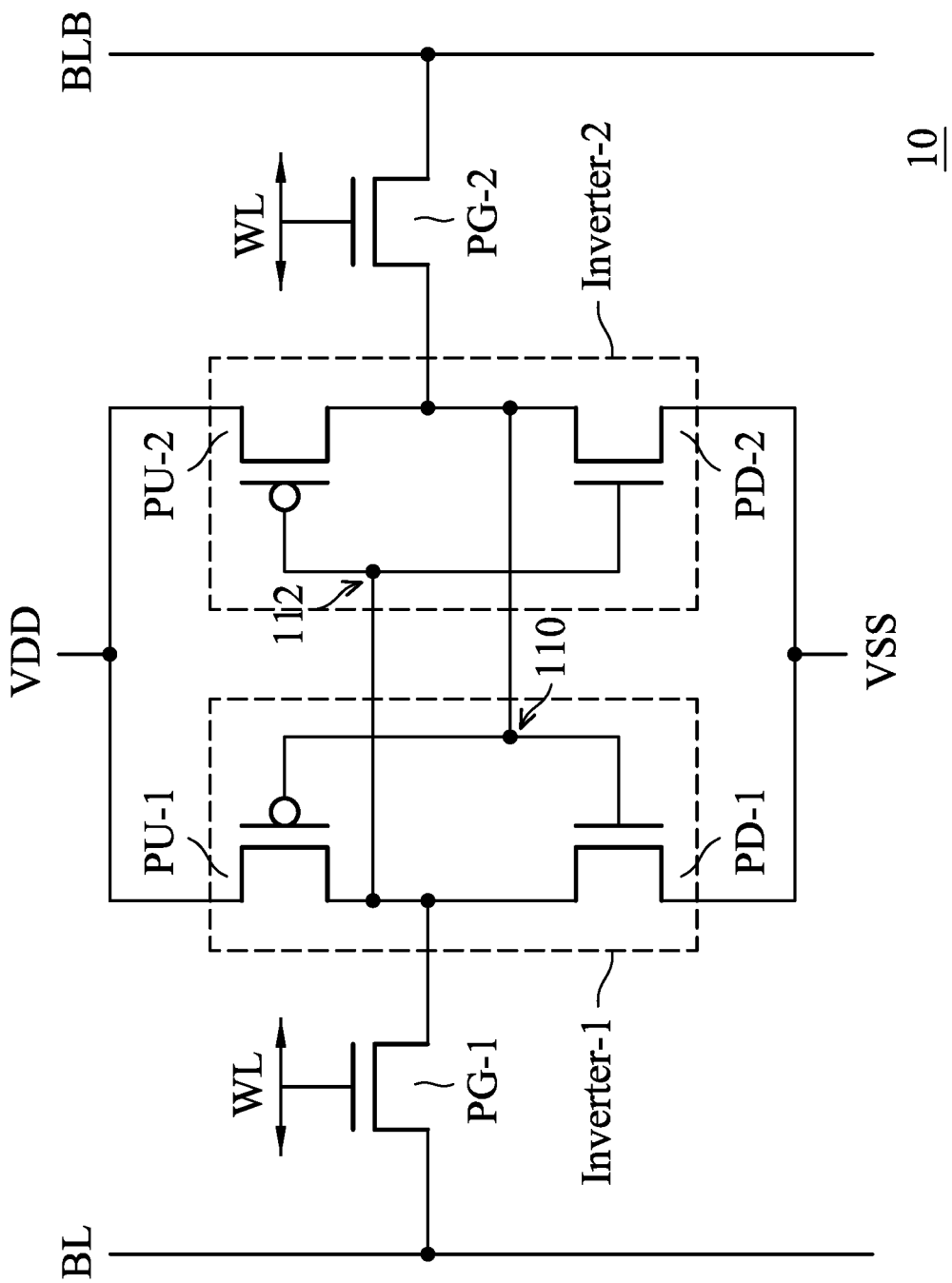
FIG. 2B shows a simplified diagram of the SRAM cell of FIG. 2A, in accordance with some embodiments of the disclosure.

FIG. 2B shows a simplified diagram of the SRAM cell 10 of FIG. 2A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 112 connecting the pass-gate transistor PG-1. The gates of the pull-up transistor PU-1 and the pull-down transistor PD-1 are coupled to the node 110 connecting the pass-gate transistor PG-2. Furthermore, the source of the pull-up transistor PU-1 is coupled to the positive power supply node VDD, and the source of the pull-down transistor PD-1 is coupled to a ground VSS.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node 110 connecting the pass-gate transistor PG-2. The gates of the pull-up transistor PU-2 and the pull-down transistor PD-2 are coupled to the node 112 connecting the pass gate transistor PG-1. Furthermore, the source of the pull-up transistor PU-2 is coupled to the positive power supply node VDD, and the source of the pull-down transistor PD-2 is coupled to the ground VSS.

In some embodiments, the pass-gate transistors PG-1 and PG-2, the pull-up transistors PU-1 and PU-2, and the pull-down transistors PD-1 and PD-2 of the SRAM cell 10 are fin field effect transistors (FinFETs).

In some embodiments, the pass-gate transistors PG-1 and PG-2, the pull-up transistors PU-1 and PU-2, and the pull-down transistors PD-1 and PD-2 of the SRAM cell 10 are planar MOS devices.

FIGS. 3A through 3D illustrate block diagrams of a layout of features of the SRAM cell 10, in accordance with some embodiments of the disclosure. FIGS. 3A through 3D illustrates features in different levels of the SRAM cell 10.

Figure 3A:
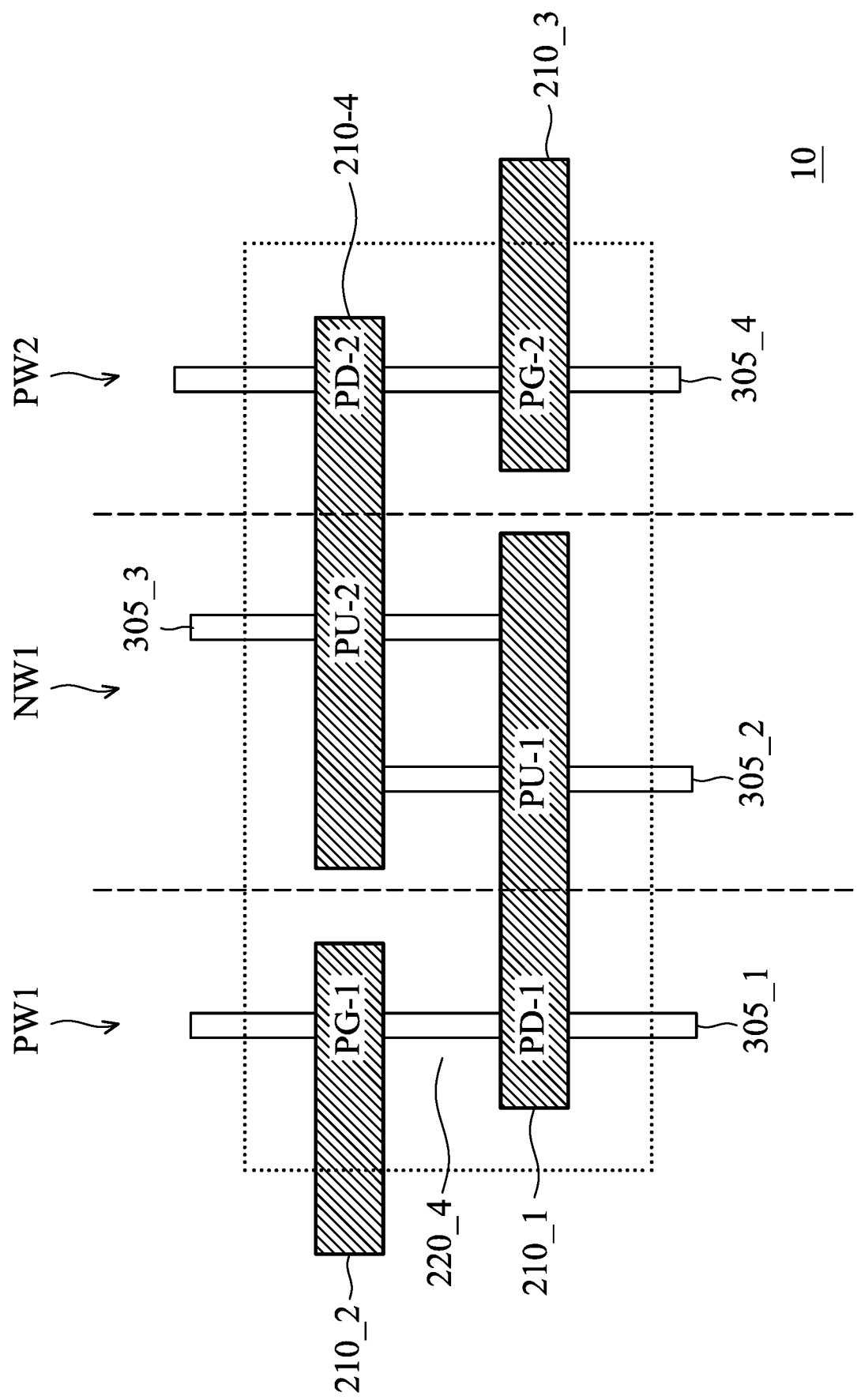
FIGS. 3A through 3D illustrate block diagrams of a layout of features of the SRAM cell, in accordance with some embodiments of the disclosure.

In FIG. 3A, an N-type well region NW1 is at the middle of SRAM cell 10, and two P-type well regions PW1 and PW2 are on opposite sides of N-type well region NW1. A gate electrode 210_1 forms the pull-up transistor PU-1 with an underlying active region 305_2 in the N-type well region NW1. In some embodiments, the active region 305_2 is fin-based and includes one or more fin structures disposed under the gate electrode 210_1 (e.g., the gate electrode 210_1 may be disposed over and extend along sidewalls of the active region 305_2). The gate electrode 210_1 further forms the pull-down transistor PD-1 with the underlying active region 305_1 in P-type well region PW1 (e.g., on the left side of N-type well region NW1). In other words, the gate electrode 210_1 is shared by the pull-up transistor PU-1 and the pull-down transistor PD-1. In some embodiments, the active region 305_1 is fin-based and includes one or more continuous fin structures disposed under the gate electrode 210_1 (e.g., the gate electrode 210_1 may be disposed over and extend along sidewalls of the active region 305_1).

The gate electrode 210_2 forms the pass-gate transistor PG-1 with the active region 305_1. In other words, the active region 305_1 is shared by the pass-gate transistor PG-1 and the pull-down transistor PD-1. In some embodiments, the gate electrode 210_2 is disposed over and extends along sidewalls of the active region 305_1.

In FIG. 3A, the gate electrode 210_4 forms the pull-up transistor PU-2 with an underlying active region 305_3 in the N-type well region NW1. In some embodiments, the active region 305_3 is fin-based and includes one or more fin structures disposed under the gate electrode 210_4 (e.g., the gate electrode 210_4 may be disposed over and extend along sidewalls of the active region 305_3). The gate electrode 210_4 further forms the pull-down transistor PD-2 with an underlying active region 305_4 in the P-type well region PW2 (e.g., on the right side of the N-type well region NW1 opposing the P-type well region PW1). In other words, the gate electrode 210_4 is shared by the pull-up transistor PU-2 and the pull-down transistor PD-2. In some embodiments, the active region 305_4 is fin-based and includes one or more fin structures disposed under the gate electrode 210_4 (e.g., the gate electrode 210_4 may be disposed over and extend along sidewalls of the active region 305_4).

Gate electrode 210_3 forms the pass-gate transistor PG-2 with the underlying active region 305_4. In other words, the active region 305_4 is shared by the pass-gate transistor PG-2 and the pull-down transistor PD-2. In some embodiments, the gate electrode 210_3 is disposed over and extends along sidewalls of the active region 305_4.

As described above, the pass-gate transistors PG-1 and PG-2, the pull-up transistors PU-1 and PU-2, and the pull-down transistors PD-1 and PD-2 are FinFETs, and the active regions 305_1 through 305_4 include one or more fin structures. In some embodiments, one or more of the pass-gate transistors PG-1 and PG-2, the pull-up transistors PU-1 and PU-2, and the pull-down transistors PD-1 and PD-2 are planar MOS devices having active regions doped in an upper surface of a semiconductor substrate. The active regions 305_1 through 305_4 provide source/drains of various transistors on opposing sides of a respective gate electrode.

FIG. 3A shows a single fin for each of the active regions 305_1 through 305_4. In some embodiments, there may be a single fin, two fins, three fins, or more for the active regions 305_1 through 305_4, and the number of fins in the active regions 305_1 through 305_4 may be the same or different as other active regions in the SRAM cell 10.

Figure 3B:
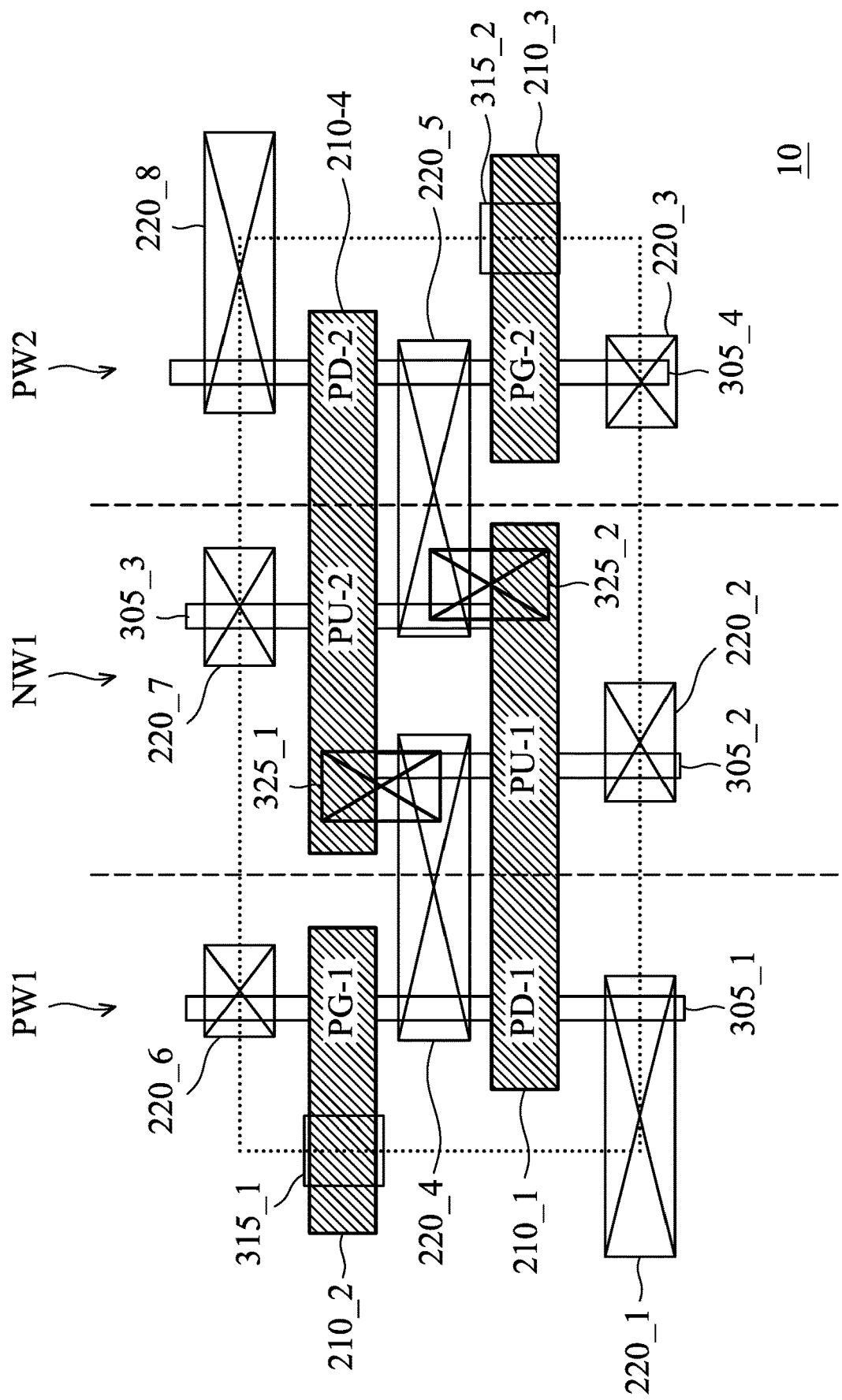

FIG. 3B shows features of the SRAM cell 10 in a contact level and lower. The contact level may include gate contacts (also referred to as contact plugs) for connecting the gate electrodes of the transistors (e.g., PG-1, PG-2, PD-1, PD-2, PU-1 and PU-2) to an overlying level, and the source/drain contacts (also referred to as "contact") for connecting the source/drain regions of transistors to the overlying level.

In FIG. 3B, the source/drain contact 220_5 is a longer contact, and is elongated and has a longitudinal direction in the X direction, which is parallel to the extending directions of the gate electrodes 210_1 and 210_4. The contact 325_2 is a butt contact, and includes a portion over, and electrically connected to, the gate electrode 210_1. In some embodiments, the contact 325_2 has a longitudinal direction in the Y direction, which is perpendicular to the X direction. In the manufacturing of the SRAM cell 10 on the semiconductor wafers, the source/drain contact 220_5 and the contact 325_2 may be formed as a single continuous butt contact.

The source/drain contact 220_4 is a longer contact, and is elongated and has a longitudinal direction in the X direction. The contact 325_1 is a butt contact, and includes a portion over, and electrically connected to, the gate electrode 210_4. In such embodiments, the details of the contact 325_1 and the source/drain contact 220_4 may be similar to the contact 325_2 and the source/drain contact 220_5, respectively, and are not repeated herein for simplicity.

The gate contacts 315_1 and 315_2 are connected to the gate electrodes 210_2 and 210_3, respectively. The gate contacts 315_1 and 315_2 may be used to electrically couple the gate electrodes 210_2 and 210_3 to one or more word line WL as described in greater detail below.

The source/drain contacts 220_1 and 220_8 are used to connect to the source regions of the pull-down transistors PD-1 and PD-2 to the VSS lines (e.g., the electrical ground lines). The source/drain contacts 220_1 and 220_8 have lengthwise directions parallel to the X direction, and may be formed to overlap the corners of the SRAM cell 10. Furthermore, the source/drain contacts 220_1 and 220_8 may further extend into neighboring SRAM cells 10 in a different column adjacent the SRAM cell 10. The source/drain contacts 220_1 and 220_8 may further be shared between two neighboring SRAM cells 10 in the adjacent rows.

Additionally, the source/drain contacts 220_2 and 220_7 are used to connect to the source regions of pull-up transistors PU-1 and PU-2 to the VDD lines (e.g., supply voltage lines). The source/drain contacts 220_2 and 220_7 may further be shared between two neighboring SRAM cells 10 in the adjacent rows.

The source/drain contacts 220_6 and 220_3 are used to connect to the source/drain regions of pass-gate transistors PG-1 and PG-2 to a BL and a BLB, respectively. The source/drain contacts 220_6 and 220_3 may further be shared between two neighboring SRAM cells in the adjacent rows.

Figure 3C:
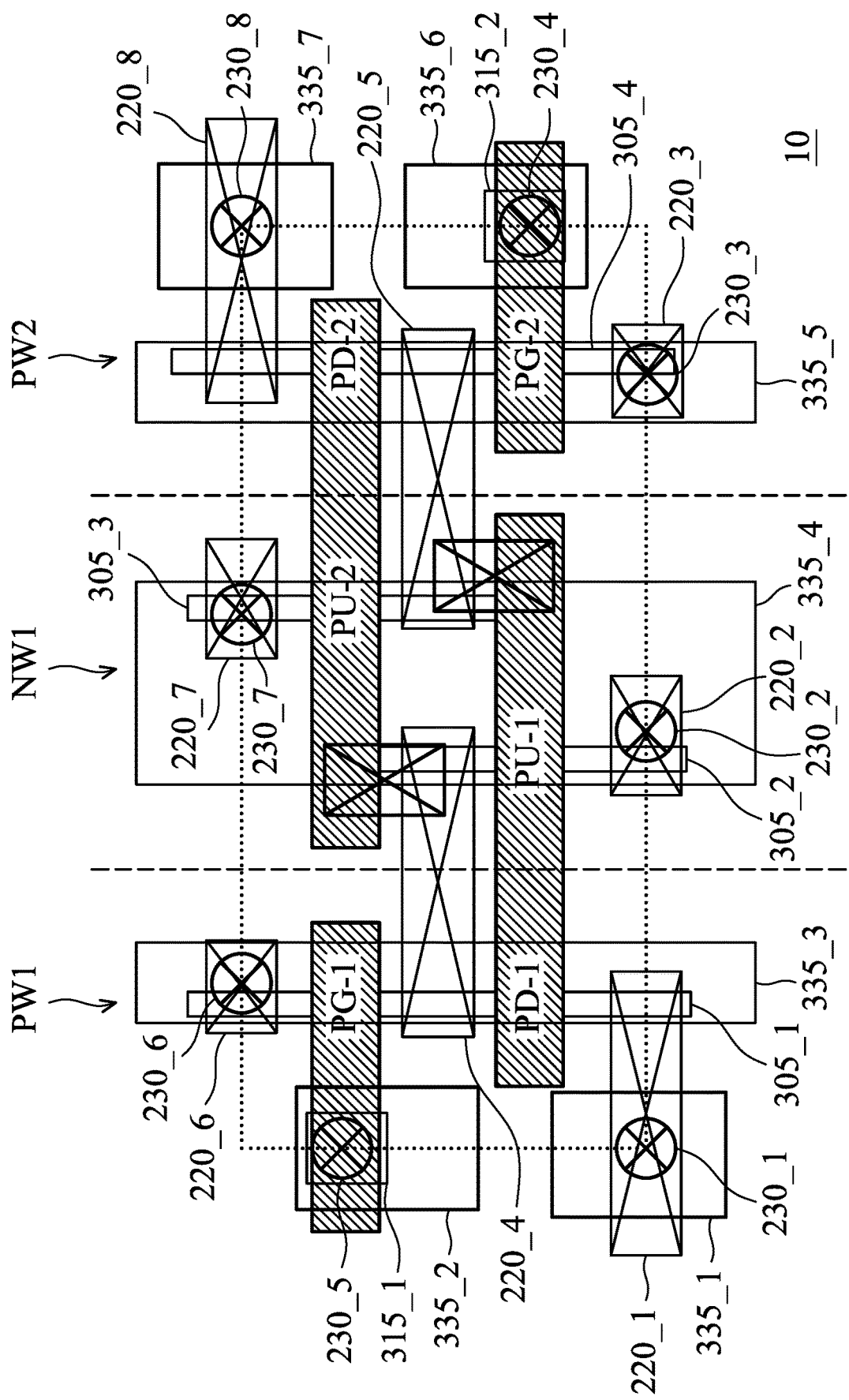

FIG. 3C shows features of SRAM cell 10 in a metal-layer level M1, a via level via_0 and lower. The vias 230_1 through 230_8 are disposed in the via level via_0, and the conductive lines 335_1 through 335_7 are disposed in the metal-layer level M1. For example, various conductive lines in the metal-layer level M1 are disposed over various vias in the via level via_0.

The vias 230_5 and 230_4 are connected to the gate contacts 315_1 and 315_2 (e.g., the gate contacts for pass-gate transistors PG-1 of PG-2). The vias 230_5 and 230_4 are further connected to the conductive lines 335_2 and 335_6, which may be used to electrically couple gate electrodes of the pass gate transistors PG-1 and PG2 to one or more word lines WL. The vias 230_5 and 230_4 and the conductive lines 335_2 and 335_6 may further extend into and shared with neighboring SRAM cells 10 in the adjacent columns.

Furthermore, the vias 230_1 and 230_8 are connected to the source/drain contacts 220_1 and 220_8 (e.g., the source contacts of the pull-down transistors PD-1 and PD-2), respectively. The vias 230_1 and 230_8 are further connected to the conductive lines 335_1 and 335_7, respectively, and the vias 230_1 and 230_8 may be used to electrically couple sources of the pull-down transistors PD-1 and PD2 to the VSS lines. Furthermore, the vias 230_1 and 230_8 and the conductive lines 335_1 and 335_7 may further extend into neighboring SRAM cells in the adjacent columns. The vias 230_1 and 230_8 and the conductive lines 335_1 and 335_7 may further be shared between two neighboring SRAM cells in different rows.

Additionally, the vias 230_2 and 230_7 are connected to the source/drain contacts 220_2 and 220_7 (e.g., the source contacts of the pull-up transistors PU-1 and PU-2). The vias 230_2 and 230_7 are further connected to the conductive lines 335_4, which electrically connects the sources of the pull-up transistors PU-1 and PU-2 to the VDD line. The vias 230_2 and 230_7 may further be shared between two neighboring SRAM cells in different rows. In some embodiment, a VDD line is shared by all SRAM cells in the same column within an SRAM array.

In FIG. 3C, the vias 230_6 and 230_3 are connected to source/drain contacts 220_6 and 220_3 (e.g., the sources of the pass-gate transistors PG-1 and PG-2), respectively. The vias 230_6 and 230_3 are further connected to the conductive lines 335_3 and 335_5, so as to electrically connect the sources of the pull-up transistors PG-1 and PG-2 to the bit line BL and the complementary bit line BLB, respectively. The vias 230_6 and 230_3 may be shared between two neighboring SRAM cells in different rows. As described above, SRAM cells 10 in the same column within the SRAM array 100 share the bit line BL and the complementary bit line BLB in the SRAM arrays 100 and 100_1.

Figure 3D:
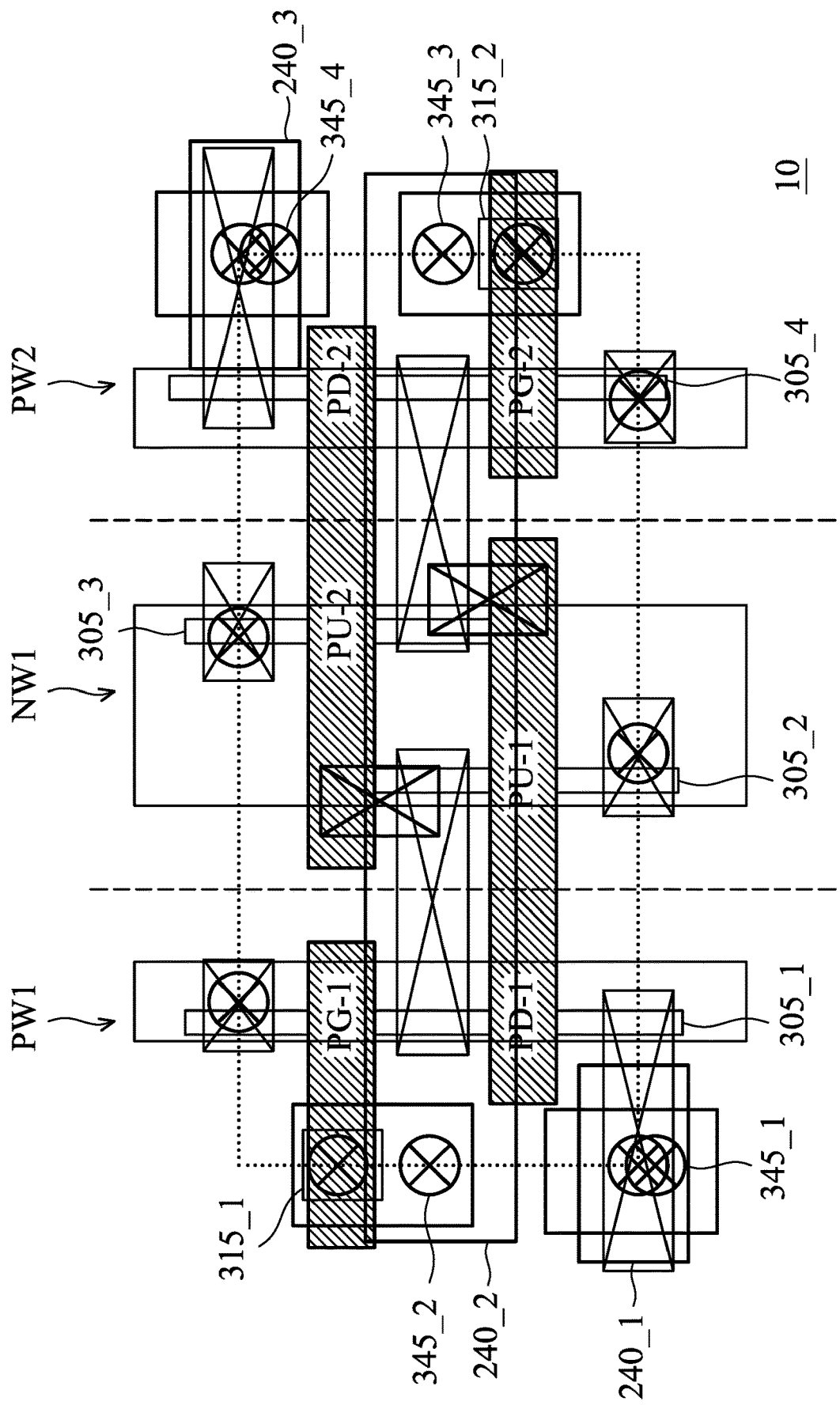

FIG. 3D shows features of SRAM cell 10 in a metal-layer level M2 and a via level via_1 and lower. The vias 345_1 through 345_4 are disposed in the via level via_1, and the conductive lines 240_1 through 240_3 are disposed in the metal-layer level M2. For example, various conductive lines in the metal-layer level M2 are disposed over various vias in the via level via_1.

In FIG. 3D, the vias 345_2 and 345_3 are connected to the conductive line 240_2, which electrically connects the gate contacts 315_1 and 315_2 (e.g., the gate contacts for the pass-gate transistors PG-1 and PG-2) to a word line WL. In some embodiments, the SRAM cells 10 in the same row share the same word line WL, which is used to select or de-select SRAM cells 10.

The vias 345_1 and 345_4 are connected to the conductive lines 240_1 and 240_3, respectively, so as to electrically connect the source/drain contacts 220_1 and 220_8 (e.g., the source contacts for pull-down transistors PD-1 and PD-2) to the VSS line. The conductive lines 240_1 and 240_3 may further extend into and shared with the neighboring SRAM cells 10 in the different columns and/or rows.

In some embodiments, the active regions 305_1 and 305_4 over the P-type well regions PW1 and PW2 is a Si-content fin.

In some embodiments, the pull-up transistors PU-1 and PU-2 further includes SiGe channel region, and the Ge atomic concentration is within a range of 10%~40%. Furthermore, in the pull-up transistors PU-1 and PU-2, the active region under the channel region or the S/D region further includes N-type anti-punch-through doping species and N-type Well dopant. The species of N-type dopant is selected from a group consisting of P31, As, Nitrogen, Carbon, or a combination thereof.

In some embodiments, in the pull-down transistors PD-1 and PD-2 and the pass-gate transistors PG-1 and PG-2, the active region under the channel region or S/D regions future includes P-type anti-punch-through and P-type Well dopant. The species of P-type dopant is selected from a group consisting of Boron, BF2, Indium, Carbon, or a combination thereof.

Figure 4:
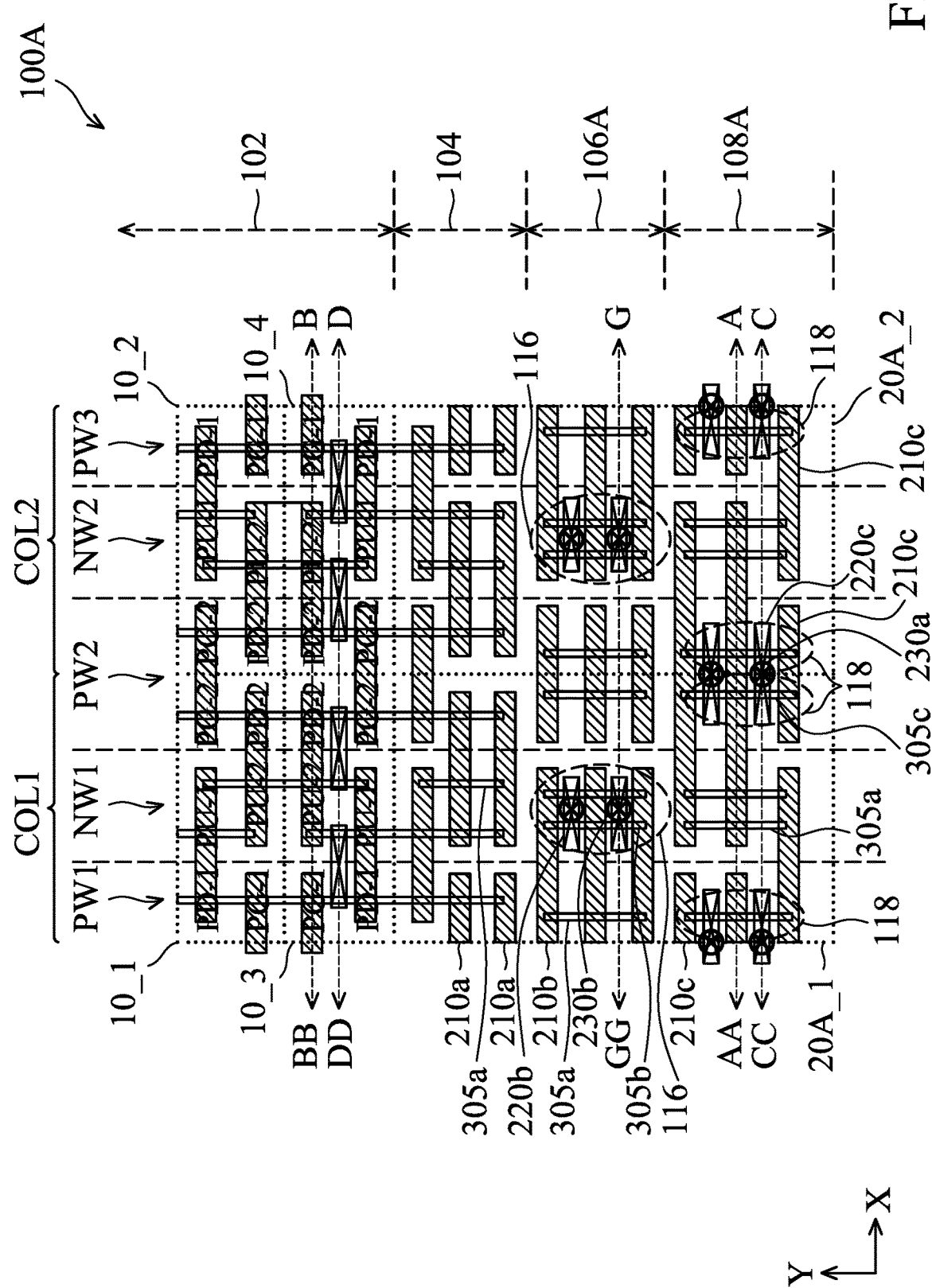
FIG. 4 shows an example layout of an SRAM array, in accordance with some embodiments of the disclosure.

FIG. 4 shows an example layout of an SRAM array 100A, in accordance with some embodiments of the disclosure. The SRAM array 100A includes the SRAM cells 10_1 through 10_4 and the well strap cells 20A_1 and 20A_2. In FIG. 4, the number of the SRAM cells 10 and the well strap cells 20 is used as an example and is not intended to limit the SRAM array 100A.

In FIG. 4, the SRAM cells 10_1 through 10_4 are disposed in a bit cell area 102 of the SRAM array 100A.

Furthermore, the SRAM cells 10_1 and 10_3 and the well strap cell 20A_1 are arranged in the first column COL1 of the SRAM array 100A, and the SRAM cells 10_2 and 10_4 and the well strap cell 20A_2 are arranged in the second column COL2 of the SRAM array 100A. Furthermore, the well strap cells 20A_1 and 20A_2 are arranged at an end of each column of SRAM array 100A. In such embodiments, the layout of the SRAM cell 10_3 is similar to the layout of the SRAM cell 10 in FIGS. 3A-3D.

In some embodiments, the two adjacent SRAM cells 10_1 and 10_2 are arranged in mirror symmetry along the Y-direction. Similarly, the two adjacent SRAM cells 10_3 and 10_4 are arranged in mirror symmetry along the Y-direction. Furthermore, the two adjacent well strap cells 20A_1 and 20A_2 are arranged in mirror symmetry along the Y-direction.

In some embodiments, the two adjacent SRAM cells 10_1 and 10_3 are arranged in mirror symmetry along the X-direction. Similarly, the two adjacent SRAM cells 10_2 and 10_4 are arranged in mirror symmetry along the X-direction.

The well strap cells 20A_1 and 20A_2 include a dummy area 104 adjacent the bit cell area 102, and the dummy area 104 includes a plurality of dummy gate electrodes 210a and/or dummy active regions 305a. In some embodiments, the active regions of the SRAM cells 10_3 and 10_4 will extend to the dummy area 104. In some embodiments, the dummy gate electrode 210a includes the materials used to form the gate electrodes of the transistors included in the SRAM cells 10_1 through 10_4.

Each of the well strap cells 20A_1 and 20A_2 further includes an N-well strap area 106A and a P-well strap area 108A. The N-well strap area 106A are arranged between the P-well strap area 108A and the dummy area 104.

The N-well strap area 106A includes one or more N-well strap structures 116, a plurality of dummy gate electrodes 210b and/or dummy active regions 305a (e.g., the fins). In some embodiments, the dummy gate electrodes 210b includes the materials used to form the gate electrodes of the transistors included in the SRAM cells 10_1 through 10_4.

The N-well strap structures 116 are positioned over the N-type well regions NW1 and NW2 in the SRAM array 100A. For example, the N-well strap structures 116 of the well strap cell 20A_1 is positioned in the N-type well region NW1, and the N-well strap structures 116 of the well strap cell 20A_2 are positioned in the N-type well region NW2.

In some embodiments, the N-well strap structures 116 are formed over N-type oxide definition regions that are over the N-well regions. In some embodiments, the N-type oxide definition region includes silicon-phosphate. In some embodiments, the SRAM array 100A is formed over a silicon substrate, and the silicon-phosphate is epitaxially grown over the N-well regions on the silicon substrate. The N-well strap structure 116 forms the N-well pick up area to electrically connect the N-type well regions NW1 and NW2 of the well strap cells 20A_1 and 20A_2 with the VDD line, so as to help with the uniform charge distribution through the SRAM array 100A.

Each N-well strap structure 116 includes the gate electrodes 210b, the active regions 305b, the source/drain contacts 220b, and the vias 230b. The N-well strap structure 116 is configured to electrically connect the N-type well region NW1/NW2 to the VDD line through the conductive line (not shown). In order to simplify the description, the interconnect structure between the VDD line and the N-well strap structure 116 is omitted.

The P-well strap area 108A includes one or more P-well strap structures 118, a plurality of dummy gate electrodes 210c and/or dummy active regions 305a (e.g., the fins). In some embodiments, the dummy gate electrodes 210c includes the materials used to form the gate electrodes of the transistors included in the SRAM cells 10_1 through 10_4. In some embodiments, the active regions of the P-well strap area 108A includes at least one Si-content fin line.

The P-well strap structures 118 are positioned over the P-type well regions PW1 through PW3 in the SRAM array 100A. For example, the P-well strap structures 118 of the well strap cell 20A_1 is positioned in the P-type well regions PW1 and PW2, and the P-well strap structures 118 of the well strap cell 20A_2 is positioned in the P-type well region PW2 and PW3. In some embodiments, the P-well strap structures 118 are formed over P-type oxide definition regions that are over the P-well regions. In some embodiments, the P-type oxide definition region includes silicon-phosphate. In some embodiments, the SRAM array 100A is formed over a silicon substrate, and the silicon-phosphate is epitaxially grown over the P-well regions on the silicon substrate. The P-well strap structure 118 forms the P-well pick up area to electrically connect the P-type well regions PW1 through PW3 of the well strap cells 20A_1 and 20A_2 with the VSS line, so as to help with the uniform charge distribution through the SRAM array 100A.

Each P-well strap structure 118 includes the gate electrodes 210c, the active region 305c, the source/drain contacts 220c, and the vias 230c. Each P-well strap structure 118 is configured to electrically connect the P-type well region PW1/PW2/PW3 to the VSS line through the conductive line (not shown). In order to simplify the description, the interconnect structure between the VSS line and the P-well strap structure 118 is omitted.

Figure 5A:
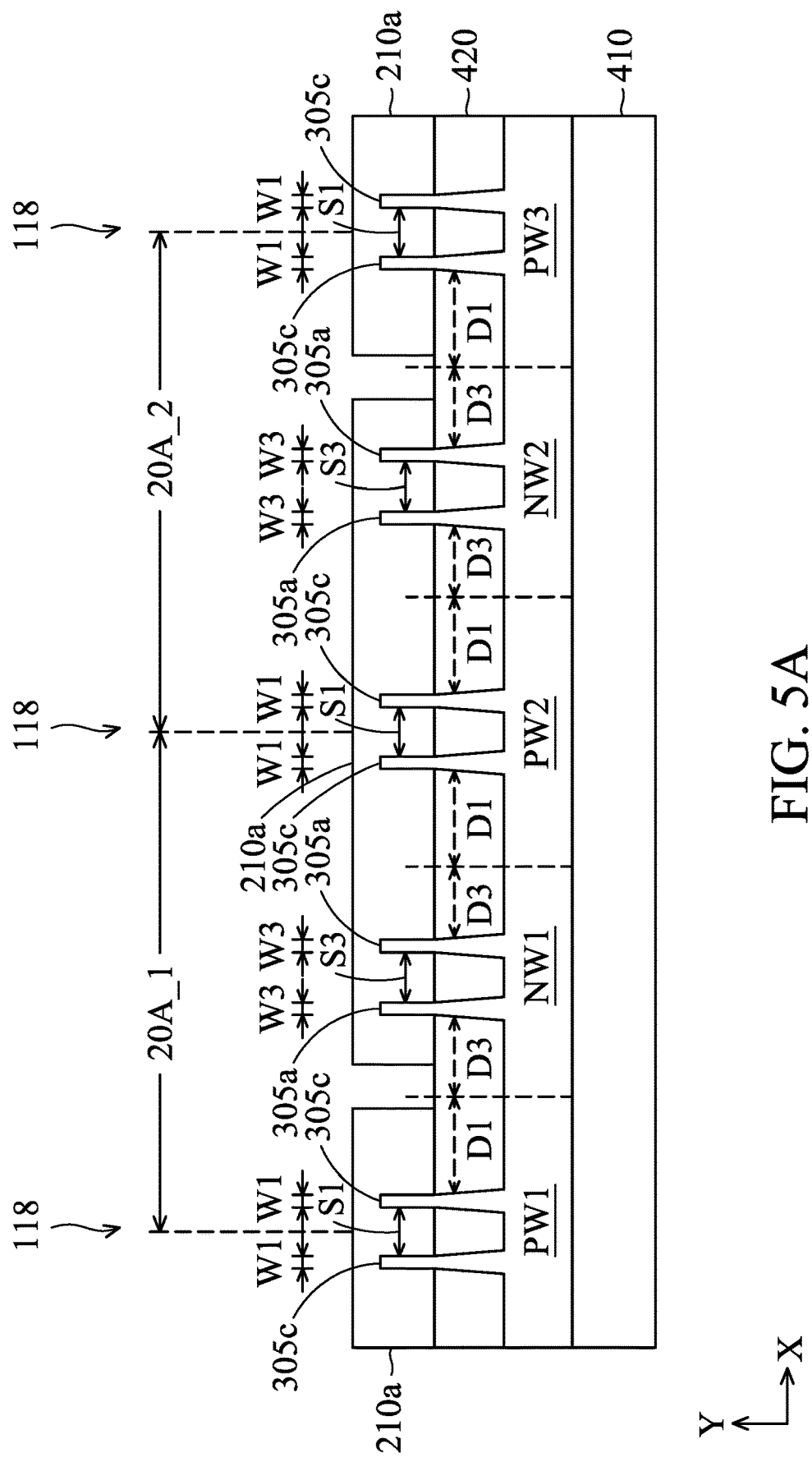
FIG. 5A shows a cross-sectional view of the SRAM array along section line AA-A of FIG. 4, in accordance with some embodiments of the disclosure.

FIG. 5A shows a cross-sectional view of the SRAM array 100A along section line AA-A of FIG. 4, in accordance with some embodiments of the disclosure. The P-type well regions PW1 through PW3 and the N-type well regions NW1 and NW2 are formed on a substrate 410. In some embodiments, the substrate 410 is a Si substrate.

The active regions 305c are fins having a width W1 and formed on the P-type well regions PW1 through PW3. In some embodiments, the active regions 305c include an appropriate concentration of P-type dopants (e.g., boron (such as 11B), boron, boron fluorine ($BF_2$), or a combination thereof). The active regions 305c are separated from each other by the shallow trench isolation (STI) 420. In such embodiments, each active region 305c has a first distance D1 from the active region 305c (i.e., itself) to the boundary of the adjacent N-type well region NW1/NW2 along the X-direction. Furthermore, for the two adjacent well strap cells 20A_1 and 20A_2, the active regions 305c of the P-well strap structures 118 of the two adjacent well strap cells 20A_1 and 20A_2 have a first fin-to-fin space S1 in the same P-type well region PW1/PW2/PW3.

The active regions 305a are fins having a width W3 and formed on the N-type well regions NW1 and NW2. In some embodiments, the active regions 305a include an appropriate concentration of n-type dopants (e.g., phosphorous (such as 31P), arsenic, or a combination thereof). The active regions 305a are separated from each other by the STI 420. In such embodiments, each active region 305a has a third distance D3 from the active region 305a (i.e., itself) to the boundary of the adjacent P-type well region PW1/PW2/PW3 along the X-direction. Furthermore, for each of the well strap cells 20A_1 and 20A_2, the dummy active regions 305a have a third fin-to-fin space S3 in the same N-type well region NW1/NW2.

In some embodiments, in the N-type well regions NW1 and NW2, configurations of the active region 305b of the N-well strap structures 116 in the N-well strap area 106A are the same as that of the active region 305a in the P-well strap area 108A. For example, in the N-well strap area 106A, each active region 305b has a third distance D3 from the active region 305b (i.e., itself) to the boundary of the adjacent P-type well region PW1/PW2/PW3 along the X-direction. Furthermore, the active regions 305b of the well strap cell 20A_1 or 20A_2 have a third fin-to-fin space S3 in the same N-type well region NW1/NW2.

In FIG. 5A, the dummy gate electrode 210a are disposed over and extend along sidewalls of the active regions 305c and 305a. In some embodiments, the dummy gate electrode 210a are electrically floating in the well strap cells 20A_1 and 20A_2.

Figure 5B:
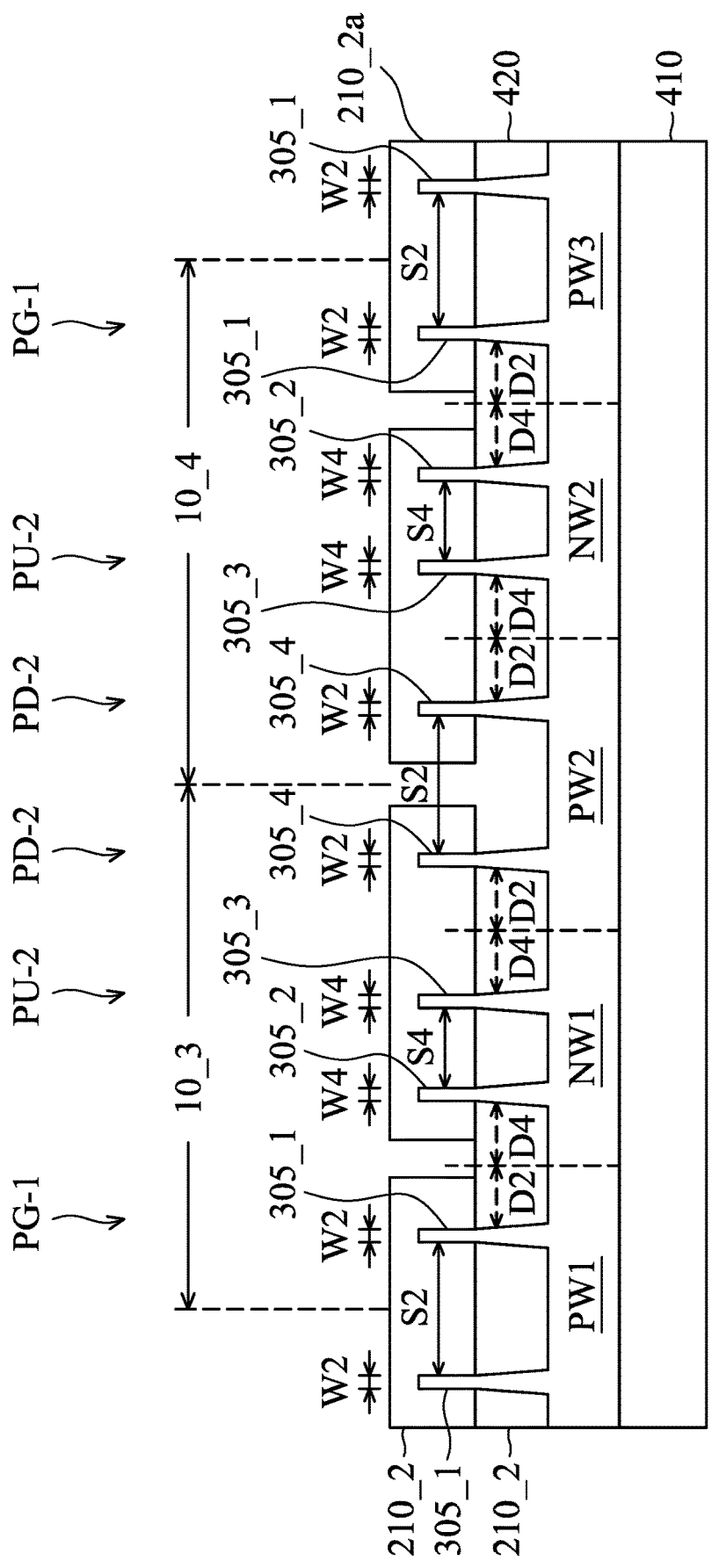
FIG. 5B shows a cross-sectional view of the SRAM array along section line BB-B of FIG. 4, in accordance with some embodiments of the disclosure.

FIG. 5B shows a cross-sectional view of the SRAM array 100A along section line BB-B of FIG. 4, in accordance with some embodiments of the disclosure. The P-type well regions PW1 through PW3 and the N-type well regions NW1 and NW2 are formed on the substrate 410.

As described above, the layout of the SRAM cell 10_3 is similar to the layout of the SRAM cell 10 in FIGS. 3A-3D, and the two adjacent SRAM cells 10_3 and 10_4 are arranged in mirror symmetry along the Y-direction.

In the SRAM cells 10_3 and 10_4, the active regions 305_1 and 305_4 are fins having a width W2 and formed on the P-type well regions PW1 through PW3. The active regions 305_1 and 305_4 are separated from each other by the STI 420. In such embodiments, the active regions 305_1/305_4 has a second distance D2 from the active region 305_1/305_4 (i.e., itself) to the boundary of the adjacent N-type well region NW1/NW2 along the X-direction. Furthermore, for the two adjacent SRAM cells (e.g., 10_3 and 10_4), the active regions 305_4 of the pull-down transistor PD-2 of the two adjacent SRAM cells (e.g., 10_3 and 10_4) have a second fin-to-fin space S2 in the same P-type well region PW2. Similarly, the active regions 305_1 of the pass-gate transistors PG-1 of the two adjacent SRAM cells have a second fin-to-fin space S2 in the same P-type well region PW1/PW3.

In the SRAM cells 10_3 and 10_4, the active regions 305_2 and 305_3 are fins having a width W4 and formed on the N-type well regions NW1 and NW2. The active regions 305_2 and 305_3 are separated from each other by the STI 420. In such embodiments, the active region 305_2/305_3 has a fourth distance D4 from the active region 305_2/305_3 (e.g., itself) to the boundary of the adjacent P-type well region PW1/PW2/PW3 along the X-direction. Furthermore, for each of the SRAM cells, the active regions 305_2 of the pull-up transistors PU-1 and the active regions 305_3 of the pull-up transistor PU-2 have a fourth fin-to-fin space S4 in the same N-type well region NW1/NW2.

In each SRAM cell (e.g., 10_3 and 10_4), the gate electrode 210_2 is disposed over and extend along sidewalls of the active region 305_1. Furthermore, the gate electrode 210_4 is disposed over and extend along sidewalls of the active regions 305_2, 305_3, and 305_4.

In some embodiments, the first distance D1 is greater than the second distance D2 (e.g., D1>D2). In some embodiments, a ratio of the first distance D1 to the second distance D2 is greater than 1.2 (e.g., D1/D2>1.2). In some embodiments, a ratio of the first distance D1 to the second distance D2 is between 1.2 and 3 (e.g., 1.2<D1/D2<3). In other words, for the same P-type well region PW1/PW2/PW3, the active region of the P-well strap structure 118 in each well strap cell 20 has larger space to the N-type well region NW1/NW2 than the active region of the transistors (e.g., PD-1, PD-2, PG-1 and PG-2) in the SRAM cell 10. Thus, a wider space between the active region 305c and boundary of the N-type well region in the P-well strap area 108A is provided. The increased distance (e.g., D1) can reduce the well inter-diffusion counter-dope effect, thus obtaining the lower well pickup resistance, so as to provide better latch up immunity.

In some embodiments, the third distance D3 is greater than the fourth distance D4 (e.g., D3>D4). In some embodiments, a ratio of the third distance D3 to the fourth distance D4 is greater than 1.2 (e.g., D3/D4>1.2). In other words, for the same N-type well region NW1/NW2, the active region of each N-well strap structure 116 in the well strap cell 20 has larger space to the P-type well region PW1/PW2/PW3 than the active region of the transistors (e.g., PU-1 and PU-2) in the SRAM cell 10. Thus, a wider space between the active region 305b and boundary of the P-type well region in the N-well strap area 106A is provided. The increased distance (e.g., D3) can reduce the well inter-diffusion counter-dope effect, thus obtaining the lower well pickup resistance, so as to provide better latch up immunity.

In some embodiments, the first width W1 is the critical dimension (CD) of the active regions (e.g., 305c) in the P-well strap structures 118 of the well strap cells (e.g., 20A_1 and 20A_2), and the second width W2 is the CD of the active regions (e.g., 305_1 and 305_4) on the P-type well region PW1/PW2/PW3 in the SRAM cells 10.

In some embodiments, the first width W1 is greater than the second width W2 (e.g., W1>W2). In some embodiments, a ratio of the first width W1 to the second width W2 is greater than 1.1 (e.g., W1/W2>1.1). In some embodiments, a ratio of the first width W1 to the second width W2 is between 1.1 and 1.5 (e.g., 1.1<D1/D2<1.5).

In some embodiments, the second fin-to-fin space S2 is greater than the first fin-to-fin space S1 (e.g., S2>S1). In some embodiments, a ratio of the second fin-to-fin space S2 to the first fin-to-fin space S1 is greater than 1.2 (e.g., S2/S1>1.2).

Figure 5C:
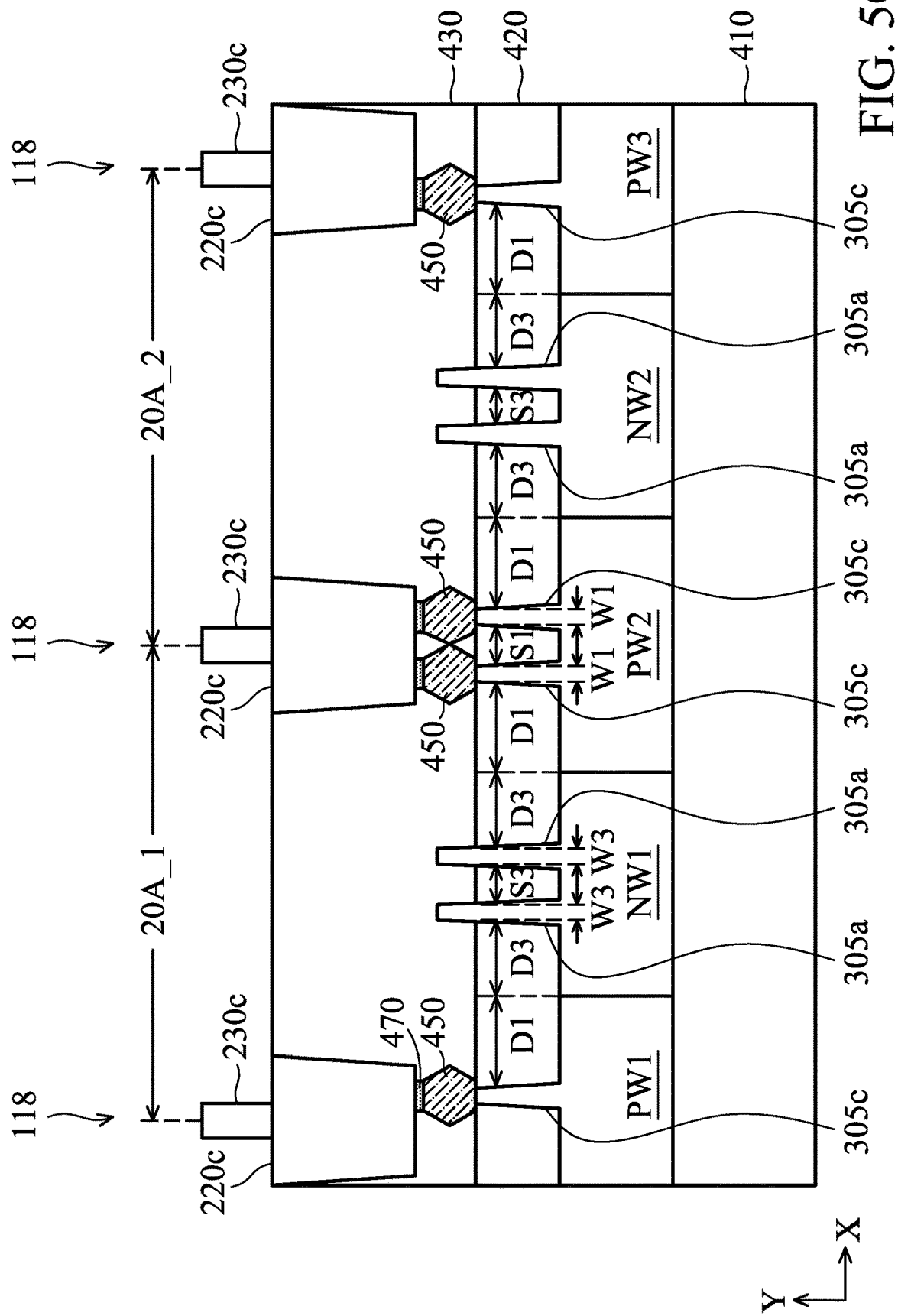
FIG. 5C shows a cross-sectional view of the SRAM array along section line CC-C of FIG. 4, in accordance with some embodiments of the disclosure.

FIG. 5C shows a cross-sectional view of the SRAM array 100A along section line CC-C of FIG. 4, in accordance with some embodiments of the disclosure. The P-type well regions PW1 through PW3 and the N-type well regions NW1 and NW2 are formed on the substrate 410.

The active regions 305c are formed on the P-type well regions PW1 through PW3. The active regions 305c are separated from each other by the STI 420. In such embodiments, each active region 305c has a first distance D1 from the active region 305c (i.e., itself) to the boundary of the adjacent N-type well region NW1/NW2 along the X-direction. Furthermore, for the two adjacent well strap cells 20A_1 and 20A_2, the active regions 305c of the P-well strap structures 118 of the two adjacent well strap cells 20A_1 and 20A_2 have a first fin-to-fin space S1 in the same P-type well region PW1/PW2/PW3.

The active regions 305a are fins having a width W3 and formed on the N-type well regions NW1 and NW2. The active regions 305a are separated from each other by the STI 420. In such embodiments, each active region 305a has a third distance D3 from the active region 305a (i.e., itself) to the boundary of the adjacent P-type well region PW1/PW2/PW3 along the X-direction. Furthermore, for each of the well strap cells 20A_1 and 20A_2, the dummy active regions 305a have a third fin-to-fin space S3 in the same N-type well region NW1/NW2.

Inter-Layer Dielectric (ILD) 430 is formed over the STI 420. The ILD 430 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The P-type doping regions 450 form the source/drain regions on the active regions 305c. The source/drain silicide regions 470 are formed on the P-type doping regions 450. The source/drain contacts 220c are formed on the source/drain silicide regions 470 of the P-type doping regions 450. The via 230c is formed on the source/drain contacts 220c. Thus, the P-type well region PW1/PW2/PW3 is electrically connected to a VSS line through the active regions 305c, the P-type doping regions 450, the source/drain contacts 220c, the via 230c, and the interconnect layers between the via 230c and the VSS line.

In some embodiments, the material of the P-type doping region 450 includes epitaxy material. The epitaxy material is selected from a group consisting of SiGe content, SiGeC content, Ge-content, or a combination thereof.

Figure 5D:
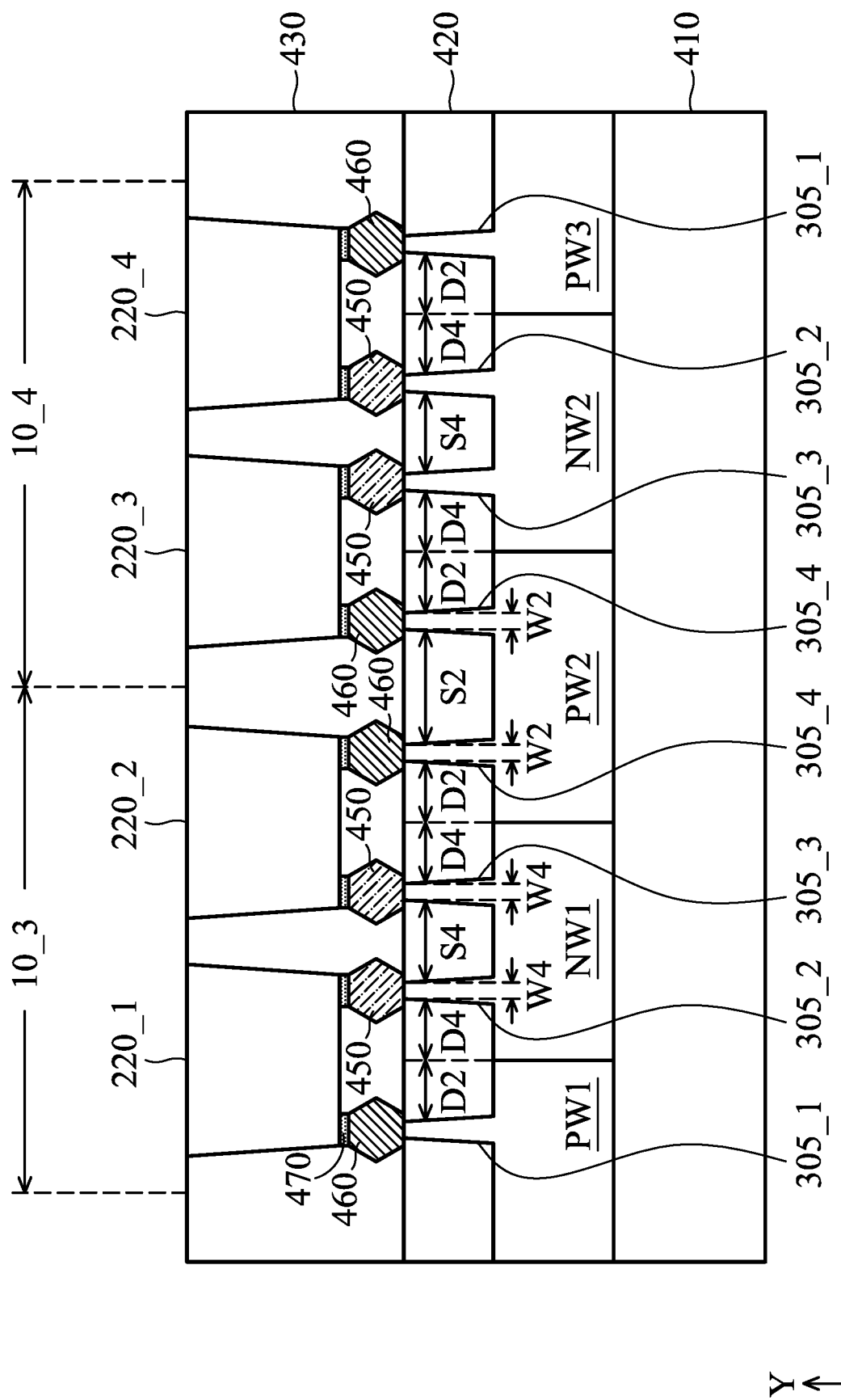
FIG. 5D shows a cross-sectional view of the SRAM array along section line DD-D of FIG. 4, in accordance with some embodiments of the disclosure.

FIG. 5D shows a cross-sectional view of the SRAM array 100A along section line DD-D of FIG. 4, in accordance with some embodiments of the disclosure. The P-type well regions PW1 through PW3 and the N-type well regions NW1 and NW2 are formed on the substrate 410.

In the SRAM cells 10_3 and 10_4, the active regions 305_1 and 305_4 are formed on the P-type well regions PW1/PW2/PW3. The active regions 305_1 and 305_4 are separated from each other by the STI 420. In such embodiments, the active regions 305_1/305_4 has a second distance D2 from the active region 305_1/305_4 (e.g., itself) to the boundary of the adjacent N-type well region NW1/NW2 along the X-direction. Furthermore, for the two adjacent SRAM cells (e.g., 10_3 and 10_4), the active regions 305_4 of the pull-down transistor PD-2 of the two adjacent SRAM cells (e.g., 10_3 and 10_4) have a second fin-to-fin space S2 in the same P-type well region PW2. Similarly, the active regions 305_1 of the pass-gate transistors PG-1 of the two adjacent SRAM cells have a second fin-to-fin space S2 in the same P-type well region PW1/PW3.

In the SRAM cells 10_3 and 10_4, the active regions 305_2 and 305_3 are fins having a width W4 and formed on the N-type well regions NW1 and NW2. The active regions 305_2 and 305_3 are separated from each other by the STI 420. In such embodiments, the active region 305_2/305_3 has a fourth distance D4 from the active region 305_2/305_3 (e.g., itself) to the boundary of the adjacent P-type well region PW1/PW2/PW3 along the X-direction. Furthermore, for each of the SRAM cells, the active regions 305_2 of the pull-up transistors PU-1 and the active regions 305_3 of the pull-up transistor PU-2 have a fourth fin-to-fin space S4 in the same N-type well region NW1/NW2.

The ILD 430 is formed over the STI 420. The P-type doping regions 450 form the source/drain regions on the active regions 305_2 and 305_3, and the N-type doping regions 460 form the source/drain regions on the active regions 305_1 and 305_4. The source/drain silicide regions 470 are formed on the P-type doping regions 450 and the N-type doping regions 460. The source/drain contacts 220_4 are formed on the source/drain silicide regions 470 of P-type doping region 450 corresponding to the active region 305_2 and the source/drain silicide regions 470 of the N-type doping region 460 corresponding to the active region 305_1. The source/drain contacts 220_5 are formed on the source/drain silicide regions 470 of the P-type doping region 450 corresponding to the active region 305_3 and the source/drain silicide regions 470 of the N-type doping region 460 corresponding to the active region 305_4.

In some embodiments, the material of the N-type doping region 460 includes epitaxy material. The epitaxy material is selected from a group consisting of SiP content, SiC content, SiPC, SiAs, Si, or a combination thereof.

Referencing FIG. 5C and FIG. 5D together, for the same P-type well region PW1/PW2/PW3, the active region 305_c is configured to form the P-well strap structure 118, and the active region 305_1/305_4 is configured to form the N-type FinFET device. Furthermore, for the same N-type well region NW1/NW2, the active region 305_b is configured to form the N-well strap structure 116, and the active region 305_2/305_3 is configured to form the P-type FinFET device.

Figure 5E:
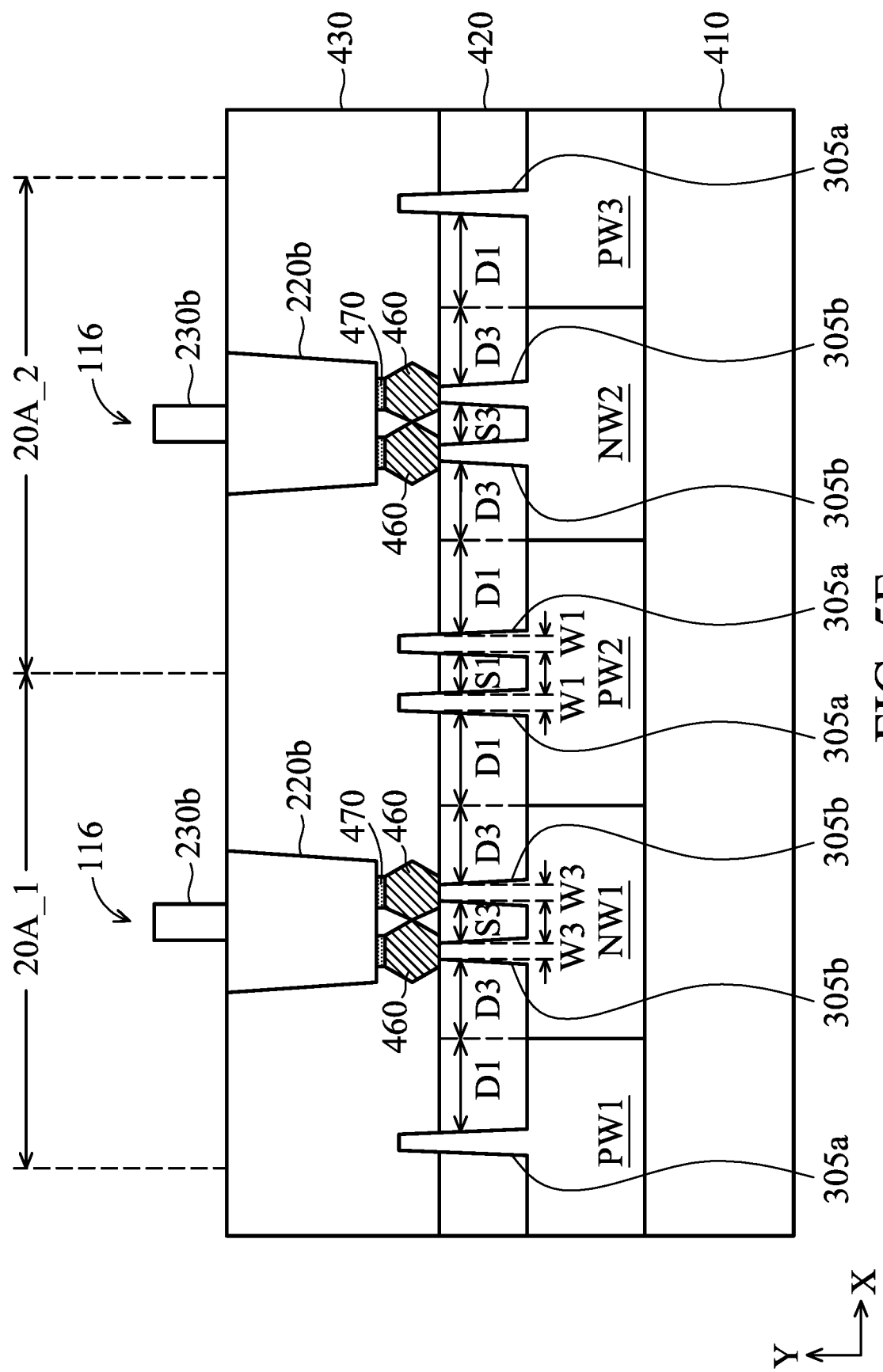
FIG. 5E shows a cross-sectional view of the SRAM array along section line GG-G of FIG. 4, in accordance with some embodiments of the disclosure.

FIG. 5E shows a cross-sectional view of the SRAM array 100A along section line GG-G of FIG. 4, in accordance with some embodiments of the disclosure. The P-type well regions PW1 through PW3 and the N-type well regions NW1 and NW2 are formed on the substrate 410.

The active regions 305b are formed on the N-type well regions NW1 and NW2. The active regions 305b are separated from each other by the STI 420. In such embodiments, each active region 305b has a third distance D3 from the active region 305b (e.g., itself) to the boundary of the adjacent P-type well region PW1/PW2/PW3 along the X-direction. Furthermore, for each of the well strap cells 20A_1 and 20A_2, the dummy active regions 305b have a third fin-to-fin space S3 in the same N-type well region NW1/NW2.

The ILD 430 is formed over the STI 420. The N-type doping regions 460 form the source/drain regions on the active regions 305b. The source/drain silicide regions 470 are formed on the N-type doping regions 460. The source/drain contacts 220b are formed on the source/drain silicide regions 470 of the N-type doping regions 460. The via 230b is formed on the source/drain contacts 220b. Thus, the N-type well region NW1/NW2 is electrically connected to a VDD line through the active regions 305b, the N-type doping regions 460, the source/drain contacts 220b, the via 230b, and the interconnect layers between the via 230b and the VDD line.

Figure 6:
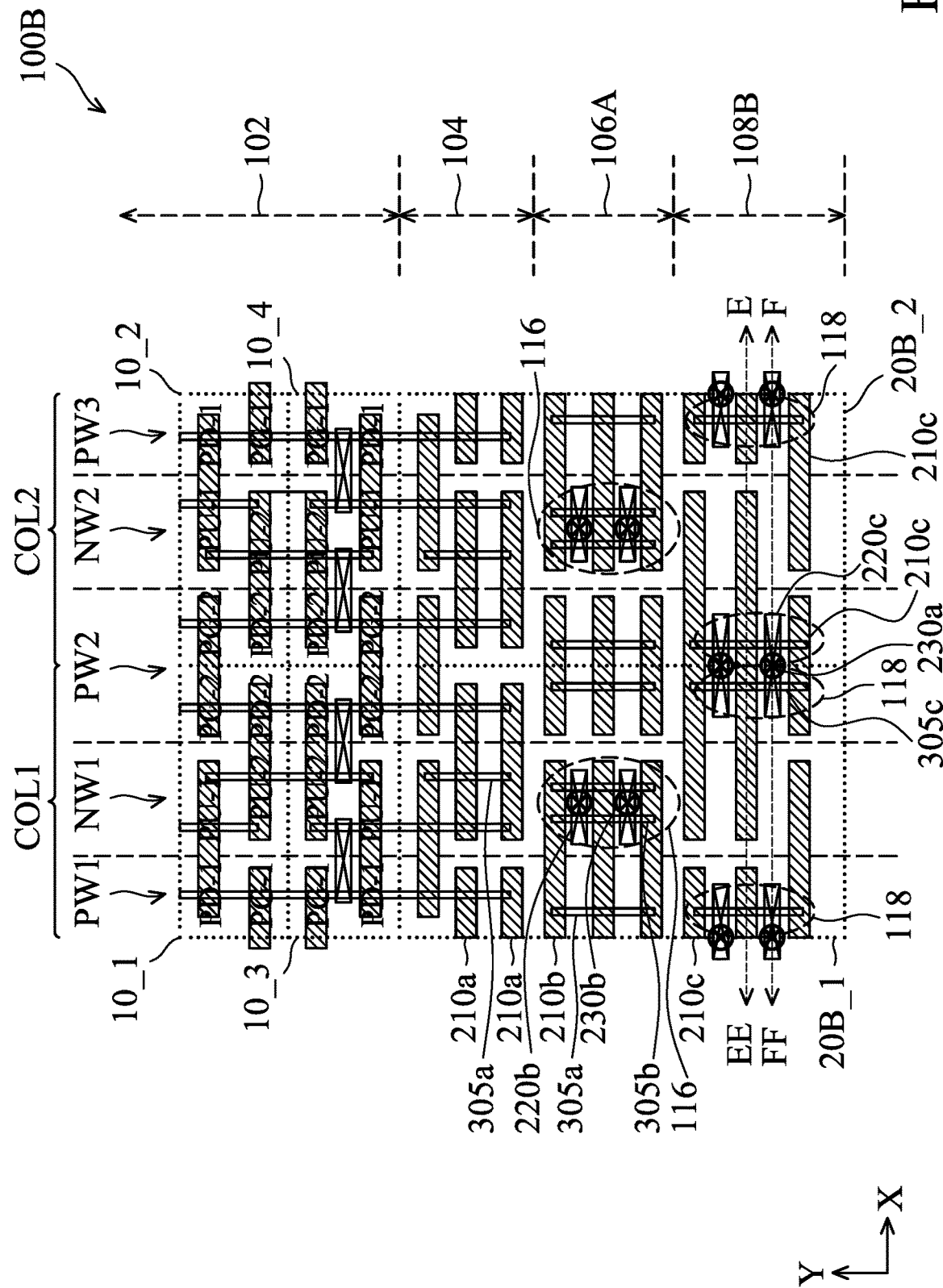
FIG. 6 shows an example layout of an SRAM array, in accordance with some embodiments of the disclosure.

FIG. 6 shows an example layout of an SRAM array 100B, in accordance with some embodiments of the disclosure. The SRAM array 100B includes the SRAM cells 10_1 through 10_4 and the well strap cells 20B_1 and 20B_2. In FIG. 6, the number of the SRAM cells 10 and the well strap cells 20 is used as an example and is not intended to limit the SRAM array 100B.

The well strap cells 20B_1 and 20B_2 include a dummy area 104 adjacent the bit cell area 102, and the dummy area 104 includes a plurality of dummy gate electrodes 210a and/or dummy active regions 305a. Each of the well strap cells 20B_1 and 20B_2 further includes an N-well strap area 106A and a P-well strap area 108B. The N-well strap area 106A are arranged between the P-well strap area 108B and the dummy area 104.

The P-well strap area 108B includes one or more P-well strap structures 118 and a plurality of dummy gate electrodes 210c. The P-well strap structures 118 are positioned over the P-type well regions in the SRAM array 100B. For example, the P-well strap structures 118 of the well strap cell 20B_1 is positioned in the P-type well regions PW1 and PW2, and the P-well strap structures 118 of the well strap cell 20B_2 is positioned in the P-type well regions PW2 and PW3. The P-well strap structures 118 forms the P-well pick up area to electrically connect the P-type well regions PW1 through PW3 of the well strap cells 20B_1 and 20B_2 with the VSS line, so as to help with the uniform charge distribution through the SRAM array 100B.

As described above, each P-well strap structure 118 includes the gate electrodes 210c, the active regions 305c, the source/drain contacts 220c, and the vias 230c. The P-well strap structure 118 is configured to electrically connect the P-type well region PW1/PW2/PW3 to the VSS line through the conductive line (not shown). In order to simplify the description, the interconnect structure between the VSS line and the P-well strap structure 118 is omitted.

Compared with the P-well strap area 108A of FIG. 4, no active region 305a is formed over the N-type well regions NW1 and NW2 in the P-well strap area 108B.

Figure 7A:
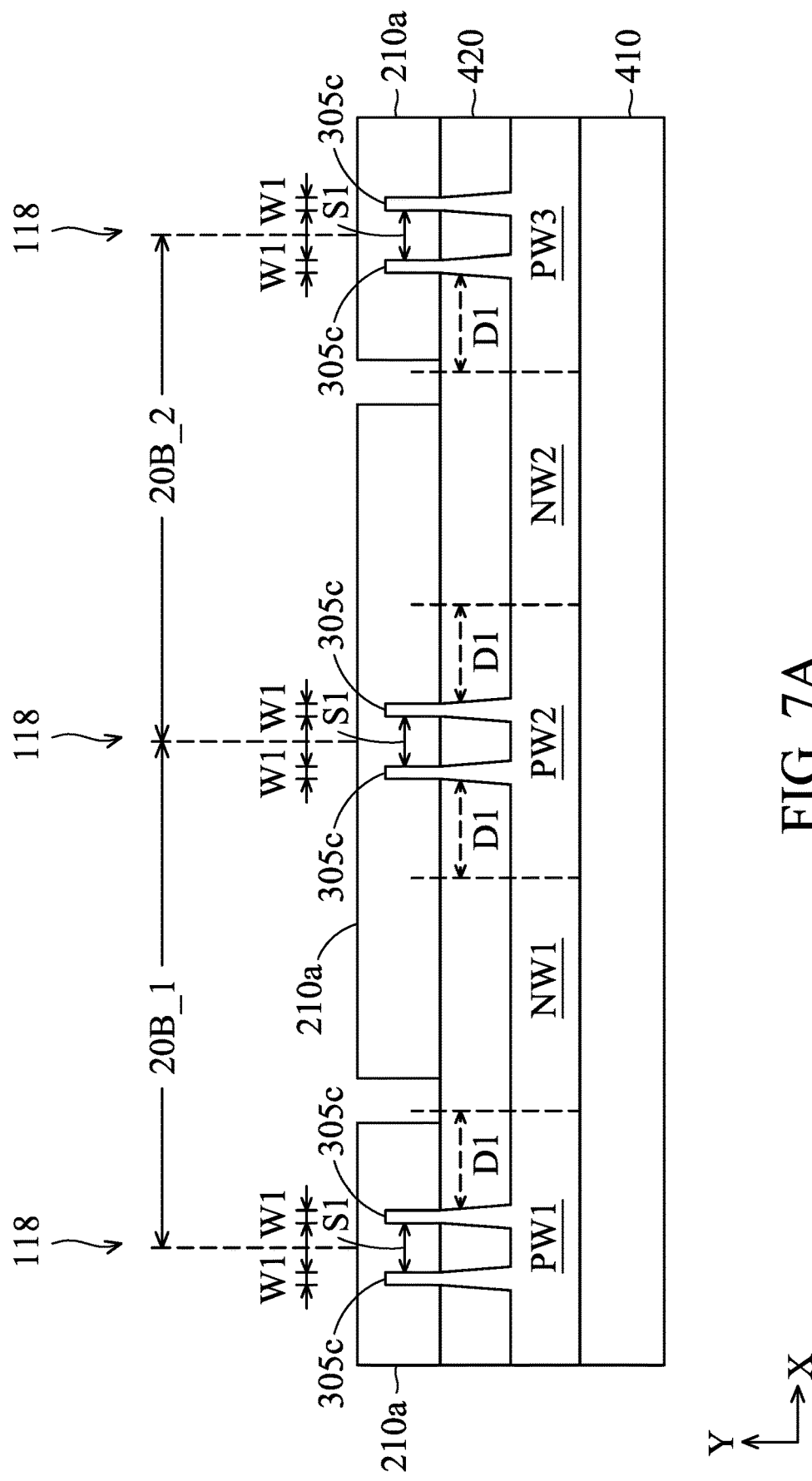
FIG. 7A shows a cross-sectional view of the SRAM array along section line EE-E of FIG. 6, in accordance with some embodiments of the disclosure.

FIG. 7A shows a cross-sectional view of the SRAM array 100B along section line EE-E of FIG. 6, in accordance with some embodiments of the disclosure. The P-type well regions PW1 through PW3 and the N-type well regions NW1 and NW2 are formed on a substrate 410. In some embodiments, the substrate 410 is a Si substrate.

The active regions 305c are fins having a width W1 and formed on the P-type well regions PW1 through PW3. In some embodiments, the active regions 305c include an appropriate concentration of P-type dopants (e.g., boron (such as 11B), boron, boron fluorine (BF$_2$), or a combination thereof). The active regions 305c are separated from each other by the STI 420. In such embodiments, each active region 305c has a first distance D1 from the active region 305c (i.e., itself) to the boundary of the adjacent N-type well region NW1/NW2 along the X-direction. Furthermore, for the two adjacent well strap cells 20B_1 and 20B_2, the active regions 305c of the P-well strap structures 118 of the two adjacent well strap cells 20B_1 and 20B_2 have a first fin-to-fin space S1 in the same P-type well region PW1/PW2/PW3.

The dummy gate electrode 210a are disposed over and extend along sidewalls of the active regions 305c and 305a. In some embodiments, the dummy gate electrode 210a are electrically floating in the well strap cells 20B_1 and 20B_2.

As described above, no active region 305a is formed over the N-type well regions NW1 and NW2 in the P-well strap area 108B of the well strap cells 20B_1 and 20B_2.

Figure 7B:
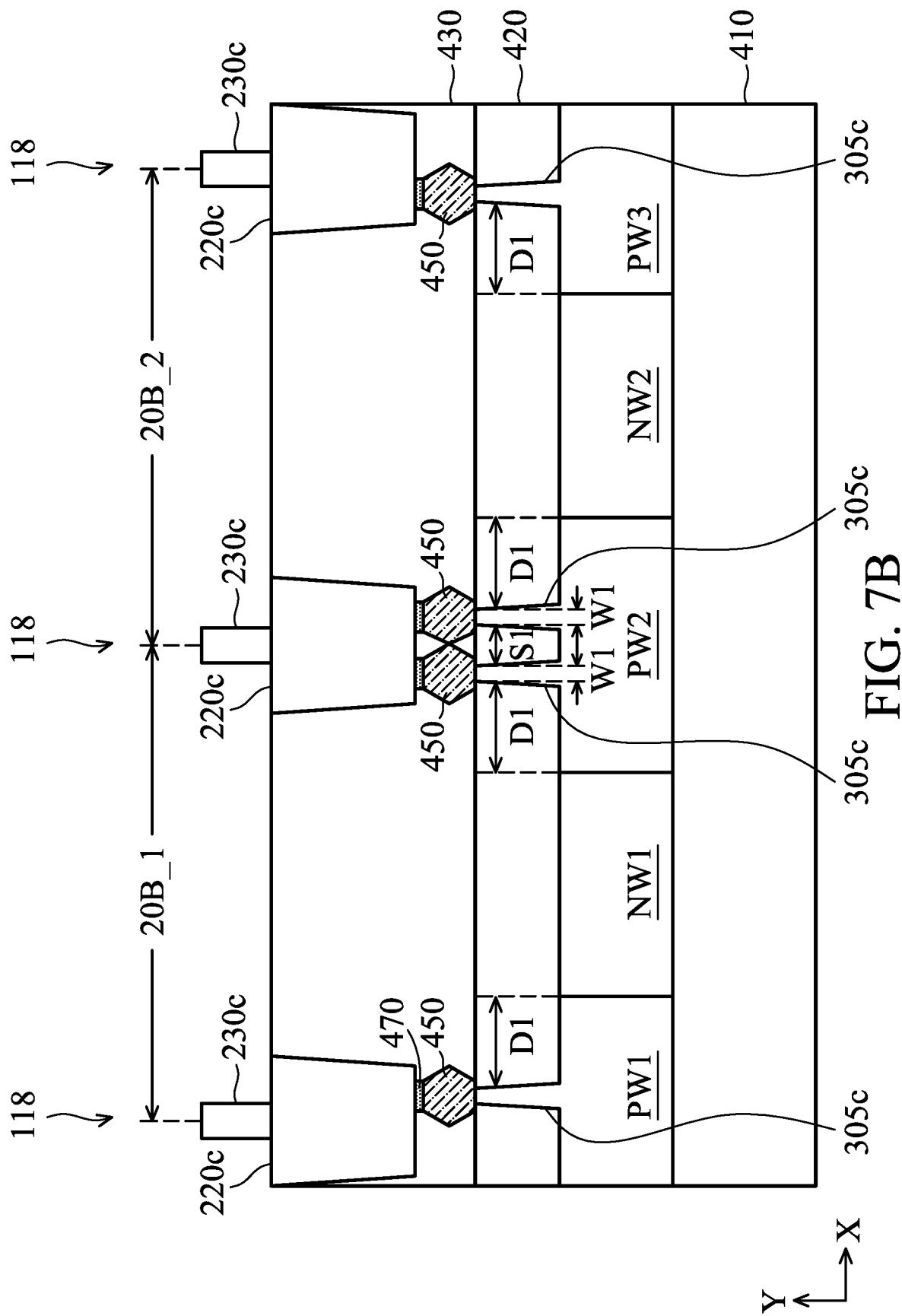
FIG. 7B shows a cross-sectional view of the SRAM array along section line FF-F of FIG. 6, in accordance with some embodiments of the disclosure.

FIG. 7B shows a cross-sectional view of the SRAM array 100B along section line FF-F of FIG. 6, in accordance with some embodiments of the disclosure. The P-type well regions PW1 through PW3 and the N-type well regions NW1 and NW2 are formed on the substrate 410.

The active regions 305c are formed on the P-type well regions PW1 through PW3. The active regions 305c are separated from each other by the STI 420. In such embodiments, each active region 305c has a first distance D1 from the active region 305c (i.e., itself) to the boundary of the adjacent N-type well region NW1/NW2 along the X-direction. Furthermore, for the two adjacent well strap cells 20B_1 and 20B_2, the active regions 305c of the P-well strap structures 118 of the two adjacent well strap cells 20A_1 and 20A_2 have a first fin-to-fin space S1 in the same P-type well region PW1/PW2/PW3.

The ILD 430 is formed over the STI 420. The P-type doping regions 450 form the source/drain regions on the active regions 305c. The source/drain silicide regions 470 are formed on the P-type doping regions 450. The source/drain contacts 220c are formed on the source/drain silicide regions 470 of the P-type doping regions 450. The via 230c is formed on the source/drain contacts 220c. Thus, the P-type well region PW1/PW2/PW3 is electrically connected to a VSS line through the active regions 305c, the P-type doping regions 450, the source/drain contacts 220c, the via 230c, and the interconnect layers between the via 230c and the VSS line.

As described above, no active region 305a is formed over the N-type well regions NW1 and NW2 in the P-well strap area 108B of the well strap cells 20B_1 and 20B_2.

FIG. 8 shows an example layout of an SRAM array 100C, in accordance with some embodiments of the disclosure. The SRAM array 100C includes the SRAM cells 10_1 through 10_4 and the well strap cells 20C_1 and 20C_2. In FIG. 8, the number of the SRAM cells 10 and the well strap cells 20 is used as an example and is not intended to limit the SRAM array 100C.

The well strap cells 20C_1 and 20C_2 include a dummy area 104 adjacent the bit cell area 102, and the dummy area 104 includes a plurality of dummy gate electrodes 210a and/or dummy active regions 305a. Each of the well strap cells 20C_1 and 20C_2 further includes an N-well strap area 106B and a P-well strap area 108B. The N-well strap area 106B are arranged between the P-well strap area 108B and the dummy area 104.

The N-well strap area 106B includes one or more N-well strap structures 116 and a plurality of dummy gate electrodes 210b. The N-well strap structures 116 are positioned over the N-type well regions in the SRAM array 100C. For example, the N-well strap structures 116 of the well strap cell 20C_1 is positioned in the N-type well region NW1, and the N-well strap structure 116 of the well strap cell 20C_2 is positioned in the N-type well region NW2. The N-well strap structures 116 forms the N-well pick up area to electrically connect the N-type well region of the well strap cells 20C_1 and 20C_2 with the VDD line, so as to help with the uniform charge distribution through the SRAM array 100C.

As described above, each N-well strap structure 116 includes the gate electrodes 210b, the active regions 305b, the source/drain contacts 220b, and the vias 230b. The N-well strap structure 116 is configured to electrically connect the N-type well region NW1/NW2 to the VDD line through the conductive line (not shown). In order to simplify the description, the interconnect structure between the VDD line and the N-well strap structure 116 is omitted.

Compared with the N-well strap area 106A of FIG. 6, no active region 305a is formed over the P-type well regions PW1 through PW3 in the N-well strap area 106B.

Figure 9:
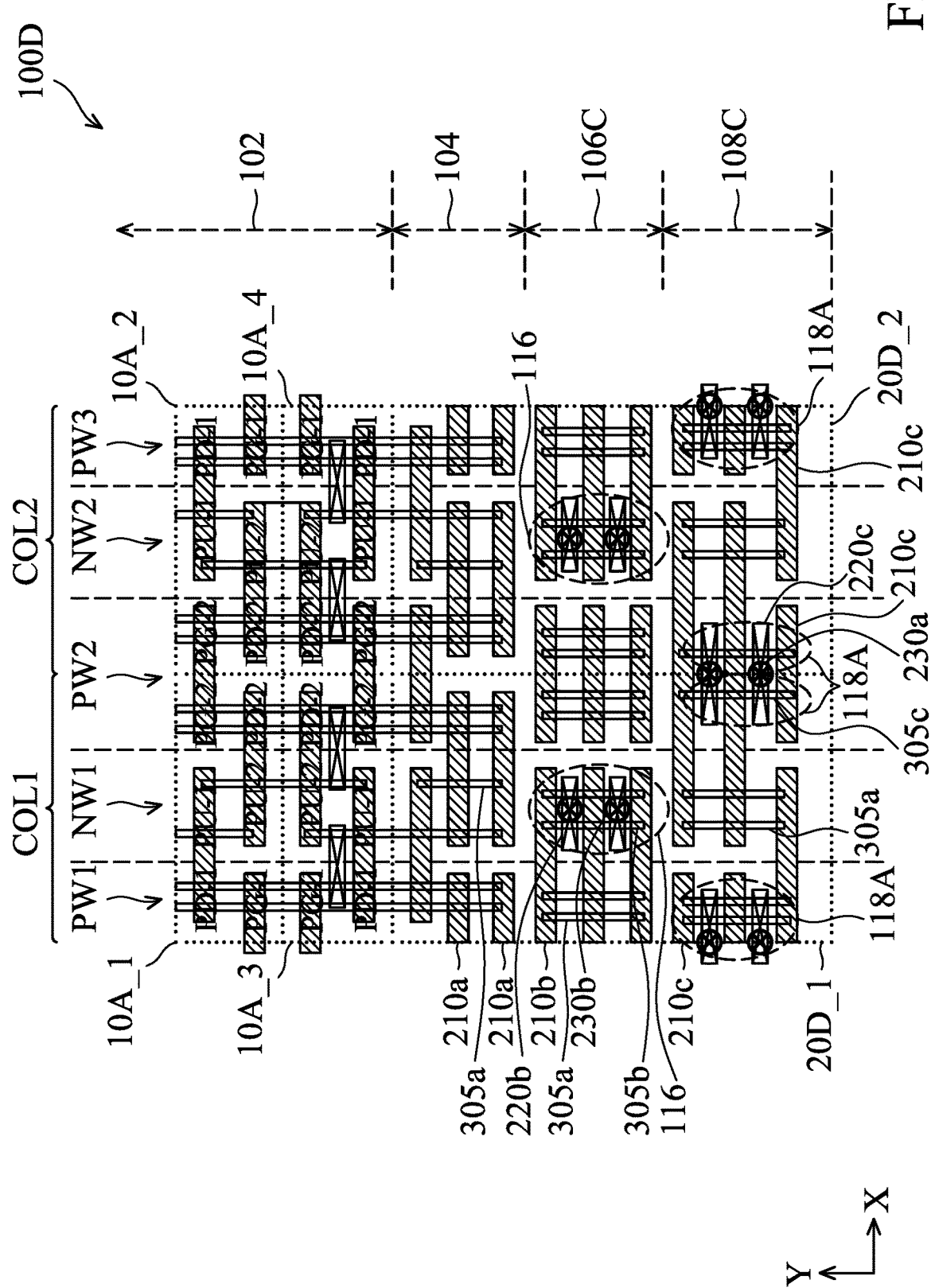
FIG. 9 shows an example layout of an SRAM array, in accordance with some embodiments of the disclosure.

FIG. 9 shows an example layout of an SRAM array 100D, in accordance with some embodiments of the disclosure. The SRAM array 100D includes the SRAM cells 10A_1 through 10A_4 and the well strap cells 20D_1 and 20D_2. In FIG. 9, the number of the SRAM cells 10 and the well strap cells 20 is used as an example and is not intended to limit the SRAM array 100D.

In FIG. 9, the SRAM cells 10A_1 through 10A_4 are disposed in a bit cell area 102 of the SRAM array 100A. Furthermore, the SRAM cells 10A_1 and 10A_3 and the well strap cell 20D_1 are arranged in the same column of the SRAM array 100D, and the SRAM cells 10A_2 and 10A_4 and the well strap cell 20D_2 are arranged in the same column of the SRAM array 100D. Furthermore, the well strap cells 20D_1 and 20D_2 are arranged at an end of each column of SRAM array 100D.

In the SRAM cells 10A_1 through 10A_4, the pull-down transistors PD-1 and PD-2 and the pass-gate transistors PG-1 and PG-2 are dual-fin FETs, and the pull-up transistors PU-1 and PU-2 are single-fin FETs.

The well strap cells 20D_1 and 20D_2 include a dummy area 104 adjacent the bit cell area 102, and the dummy area 104 includes a plurality of dummy gate electrodes 210a and/or dummy active regions 305a. Each of the well strap cells 20D_1 and 20D_2 further includes an N-well strap area 106C and a P-well strap area 108C. The N-well strap area 106C are arranged between the P-well strap area 108C and the dummy area 104.

The N-well strap area 106C includes one or more N-well strap structures 116, a plurality of dummy gate electrodes 210b and/or dummy active regions 305a. In such embodiment, a pair of dummy active regions 305a are arranged in each P_type well region for each of the well strap cells 20D_1 and 20D_2.

The P-well strap area 108C includes one or more P-well strap structures 118A, a plurality of dummy gate electrodes 210c and/or dummy active regions 305a (e.g., the fins). Each P-well strap structure 118A includes the gate electrodes 210c, the active regions 305c, the source/drain contacts 220c, and the vias 230c. The P-well strap structure 118A is configured to electrically connect the P-type well region PW1/PW2/PW3 to the VSS line through the conductive line (not shown). Compared with the single active region 305c of the P-well strap structure 118 in FIG. 4, each P-well strap structure 118A includes a pair of the active regions 305c.

Embodiments for SRAM arrays are provided. A wider space between the active region over the P-type well region and boundary of the N-type well region in the P-well strap area is provided. Furthermore, a wider space between the active region over the N-type well region and boundary of the P-type well region in the N-well strap area is provided. The increased distance can reduce the well inter-diffusion counter-dope effect, thus obtaining the lower well pickup resistance, so as to provide better latch up immunity. By arranging the positions of the active regions of the SRAM array in layout, latch up performance is improved, and specific for the single-fin FinFET device in the SRAM array.

In some embodiments, a SRAM array is provided. The SRAM array includes a plurality of SRAM cells arranged in a column of a cell array, and at least one well strap cell arranged in the column of the cell array. Each of the SRAM cells includes: a pull-down transistor formed in a P-type well region of a substrate; a pull-up transistor formed in an N-type well region of the substrate; and a pass-gate transistor formed in the P-type well region. The well strap cell includes an N-well strap structure formed on the N-type well region, and a P-well strap structure formed on the P-type well region. The N-well strap structure includes an active region and N-type doping source and drain regions configured to connect a VDD line to the N-type well region. A first distance between the active region of the N-well strap structure and the P-type well region is greater than a second distance between an active region of the pull-up transistor r and the P-type well region.

In some embodiments, a SRAM array is provided. The SRAM array includes a plurality of SRAM cells arranged in a plurality of rows and a plurality of columns of a cell array, and a plurality of well strap cells. Each of the SRAM cells arranged in the same column of the cell array includes: a pull-down transistor formed in a P-type well region of a substrate; a pull-up transistor formed in an N-type well region of the substrate; and a pass-gate transistor formed in the P-type well region. The pull-down transistor and the pass-gate transistor are single-fin N-type field effect transistors, and the pull-up transistor is single-fin P-type field effect transistor. An N-well strap structure is formed on the N-type well region, and a P-well strap structure is formed on the P-type well region. The N-well strap structure includes a fin and N-type doping source and drain regions on the fin. In the same column of the cell array, a first distance between the fin of the N-well strap structure and the P-type well region is greater than a second distance between the P-type well region and a fin of the pull-up transistor.

In some embodiments, a SRAM array is provided. The SRAM array includes a plurality of SRAM cells arranged in a plurality of rows and a plurality of columns of a cell array, and a plurality of well strap cells. Each of the SRAM cells arranged in the same column of the cell array includes: a pull-down transistor formed in a P-type well region of a substrate; a first pull-up transistor and a second pull-up transistor formed in an N-type well region of the substrate; and a pass-gate transistor formed in the P-type well region. Each of the well strap cells is arranged on one end of one of the columns in the cell array and includes an N-well strap structure formed on the N-type well region and a P-well strap structure formed on the P-type well region. The N-well strap structure includes at least one fin and N-type doping source and drain regions on the fin. In the two adjacent columns of the cell array, a first fin-to-fin distance between fins of the first and second pull-up transistor is less than a second fin-to-fin distance between single fins shared by the pull-down transistors and the pass-gate transistors of the two adjacent SRAM cells.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Static Random Access Memory (SRAM) array, comprising:
   a plurality of SRAM cells arranged in a column of a cell array, each comprising:
      a pull-down transistor formed in a P-type well region of a substrate;
      a pull-up transistor formed in an N-type well region of the substrate; and
      a pass-gate transistor formed in the P-type well region; and
   at least one well strap cell arranged in the column of the cell array, comprising:
      an N-well strap structure formed on the N-type well region and comprising an active region and N-type doping source and drain regions configured to connect a VDD line to the N-type well region; and
      a P-well strap structure formed on the P-type well region;
   wherein a first distance between the active region of the N-well strap structure and the P-type well region is greater than a second distance between an active region of the pull-up transistor and the P-type well region.

2. The SRAM array as claimed in claim 1, wherein a ratio of the first distance to the second distance is greater than 1.2.

3. The SRAM array as claimed in claim 1, wherein the well strap cell is arranged on one end or middle of the column in the cell array.

4. The SRAM array as claimed in claim 1, wherein the pull-down transistor and the pull-up transistor form an inverter, wherein the pass-gate transistor is electrically coupled to an output terminal of the inverter.

5. The SRAM array as claimed in claim 1, wherein the pull-down transistor and the pass-gate transistor are multiple-fin or single-fin field effect transistors, and the pull-up transistor is single-fin field effect transistors.

6. The SRAM array as claimed in claim 1, wherein an active region of the P-well strap structure is formed by a fin with a first width, and an active region of the pull down transistor and the pass-gate transistor is formed by a fin with a second width, wherein a ratio of the first width to the second width is between 1.1 and 1.5.

7. The SRAM array as claimed in claim 1, wherein in each of the columns of the cell array, the N-well strap structure and the P-well strap structure are arranged on both ends and the middle of the column in the cell array.

8. A Static Random Access Memory (SRAM) array, comprising:
a plurality of SRAM cells arranged in a plurality of rows and a plurality of columns of a cell array, wherein each of the SRAM cells arranged in the same column of the cell array comprises:
a pull-down transistor formed in a P-type well region of a substrate;
a pull-up transistor formed in an N-type well region of the substrate; and
a pass-gate transistor formed in the P-type well region, wherein the pull-down transistor and the pass-gate transistor are single-fin N-type field effect transistors, and the pull-up transistor is single-fin P-type field effect transistor;
an N-well strap structure formed on the N-type well region and comprising a fin and N-type doping source and drain regions on the fin; and
a P-well strap structure formed on the P-type well region;
wherein in the same column of the cell array, a first distance between the fin of the N-well strap structure and the P-type well region is greater than a second distance between the P-type well region and a fin of the pull-up transistor.

9. The SRAM array as claimed in claim 8, wherein a ratio of the first distance to the second distance is greater than 1.2.

10. The SRAM array as claimed in claim 8, wherein in each of the columns of the cell array, the N-well strap structure and the P-well strap structure are arranged on both ends and the middle of the column in the cell array.

11. The SRAM array as claimed in claim 8, wherein a fin of the P-well strap structure has a first width, and a single fin shared by the pull down transistor and the pass-gate transistor has a second width, wherein a ratio of the first width to the second width is between 1.1 and 1.5.

12. The SRAM array as claimed in claim 8, wherein the N-well strap structure is configured to connect a VDD line to the N-type well region.

13. The SRAM array as claimed in claim 8, wherein the P-well strap structure is configured to connect a VSS line to the P-type well region.

14. A Static Random Access Memory (SRAM) array, comprising:
a plurality of SRAM cells arranged in a plurality of rows and a plurality of columns of a cell array, wherein each of the SRAM cells arranged in the same column of the cell array comprises:
a pull-down transistor formed in a P-type well region of a substrate;
a first pull-up transistor and s second pull-up transistor formed in an N-type well region of the substrate; and
a pass-gate transistor formed in the P-type well region; and
a plurality of well strap cells, wherein each of the well strap cells is arranged on one end of one of the columns in the cell array and comprises:
an N-well strap structure formed on the N-type well region and comprising at least one fin and N-type doping source and drain regions on the fin;
a P-well strap structure formed on the P-type well region;
wherein in the two adjacent columns of the cell array, a first fin-to-fin distance between fins of the first and second pull-up transistors is less than a second fin-to-fin distance between single fins shared by the pull-down transistors and the pass-gate transistors of the two adjacent SRAM cells.

15. The SRAM array as claimed in claim 14, wherein a ratio of the second fin-to-fin distance to a third fin-to-fin distance between fins of the P-well strap structures of the two adjacent well strap cells is between 1.2 and 4.

16. The SRAM array as claimed in claim 14, wherein in each of the columns of the cell array, the well strap cells are arranged on both ends and the middle of the column in the cell array.

17. The SRAM array as claimed in claim 14, wherein a fin of the P-well strap structure has a first width, and a single fin shared by the pull down transistor and the pass-gate transistor has a second width, wherein a ratio of the first width to the second width is between 1.1 and 1.5.

18. The SRAM array as claimed in claim 14, in the same column of the cell array, a fourth distance between the fin of the N-well strap structure and the P-type well region is greater than a fifth distance between a fin of the first pull-up transistor and the P-type well region.

19. The SRAM array as claimed in claim 14, wherein the P-well strap structure is configured to connect a VSS line to the P-type well region.

20. The SRAM array as claimed in claim 14, wherein the pull-down transistor and the pass-gate transistors are single-fin N-type field effect transistors, and the first pull-up transistor is single-fin P-type field effect transistor.

* * * * *